(12) United States Patent
Chuang et al.

(10) Patent No.: US 11,764,103 B2
(45) Date of Patent: Sep. 19, 2023

(54) SEMICONDUCTOR FEATURE AND METHOD FOR MANUFACTURING THE SAME

(71) Applicant: TAIWAN SEMICONDUCTOR MANUFACTURING COMPANY, LTD., Hsinchu (TW)

(72) Inventors: Harry-Hak-Lay Chuang, Hsinchu (TW); Chung-Jen Huang, Hsinchu (TW); Wen-Tuo Huang, Hsinchu (TW); Wei-Cheng Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 29 days.

(21) Appl. No.: 17/471,666

(22) Filed: Sep. 10, 2021

(65) Prior Publication Data
US 2022/0359269 A1    Nov. 10, 2022

Related U.S. Application Data

(60) Provisional application No. 63/185,616, filed on May 7, 2021.

(51) Int. Cl.
*H01L 21/762* (2006.01)
*H01L 21/768* (2006.01)
*H01L 21/308* (2006.01)
*H01L 21/02* (2006.01)

(52) U.S. Cl.
CPC .. *H01L 21/76229* (2013.01); *H01L 21/02172* (2013.01); *H01L 21/308* (2013.01); *H01L 21/768* (2013.01); *H01L 21/76283* (2013.01); *H01L 21/76898* (2013.01)

(58) Field of Classification Search
None
See application file for complete search history.

(56) References Cited

U.S. PATENT DOCUMENTS

| | | | |
|---|---|---|---|
| 2014/0054743 A1* | 2/2014 | Hurwitz | H01L 21/76224 438/424 |
| 2017/0287912 A1* | 10/2017 | Tokumitsu | H01L 21/743 |
| 2020/0161218 A1* | 5/2020 | Shank | H01L 29/0649 |
| 2022/0068982 A1* | 3/2022 | Ha | H01L 27/14603 |
| 2022/0149101 A1* | 5/2022 | Lee | H01L 27/1463 |
| 2022/0238571 A1* | 7/2022 | Park | H01L 27/14636 |

* cited by examiner

*Primary Examiner* — Erik Kielin
(74) *Attorney, Agent, or Firm* — Birch, Stewart, Kolasch & Birch, LLP

(57) ABSTRACT

A semiconductor feature includes: a semiconductor substrate; a dielectric structure and a semiconductor device disposed on the semiconductor substrate; an interconnecting structure disposed in the dielectric structure and connected to the semiconductor device; an STI structure disposed in the semiconductor substrate and surrounding the semiconductor device; two DTI structures penetrating the semiconductor substrate and the STI structure and surrounding the semiconductor device; a passivation structure connected to the semiconductor substrate and the DTI structures and located opposite to the interconnecting structure; and a conductive structure surrounded by the passivation structure, penetrating the semiconductor substrate and the STI structure into the dielectric structure, located between the DTI structures and electrically connected to the semiconductor device via the interconnecting structure.

20 Claims, 17 Drawing Sheets

FIG.2

SEMICONDUCTOR FEATURE AND METHOD FOR MANUFACTURING THE SAME

REFERENCE TO RELATED APPLICATION

This application claims priority of U.S. Provisional Application No. 63/185,616 filed on May 7, 2021, the contents of which is incorporated herein by reference in its entirety.

BACKGROUND

Nowadays, although electronic devices with low power consumption are rather popular for applications in portable devices, etc., there are also high demands in high power devices, which can be applied in various fields, such as industrial control system, aviation, automobile, etc. Stringent quality standards need to be applied in those fields so as to ensure the safety of the operators or passengers. In addition, with the increasing manufacturing costs associated with continuous shrinkage of semiconductor devices, it is also desirable to manufacture semiconductor devices with reduced cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 17 are intermediate steps of the method for manufacturing the semiconductor feature in accordance with some embodiments.

DETAILED DESCRIPTION

Figure 1:
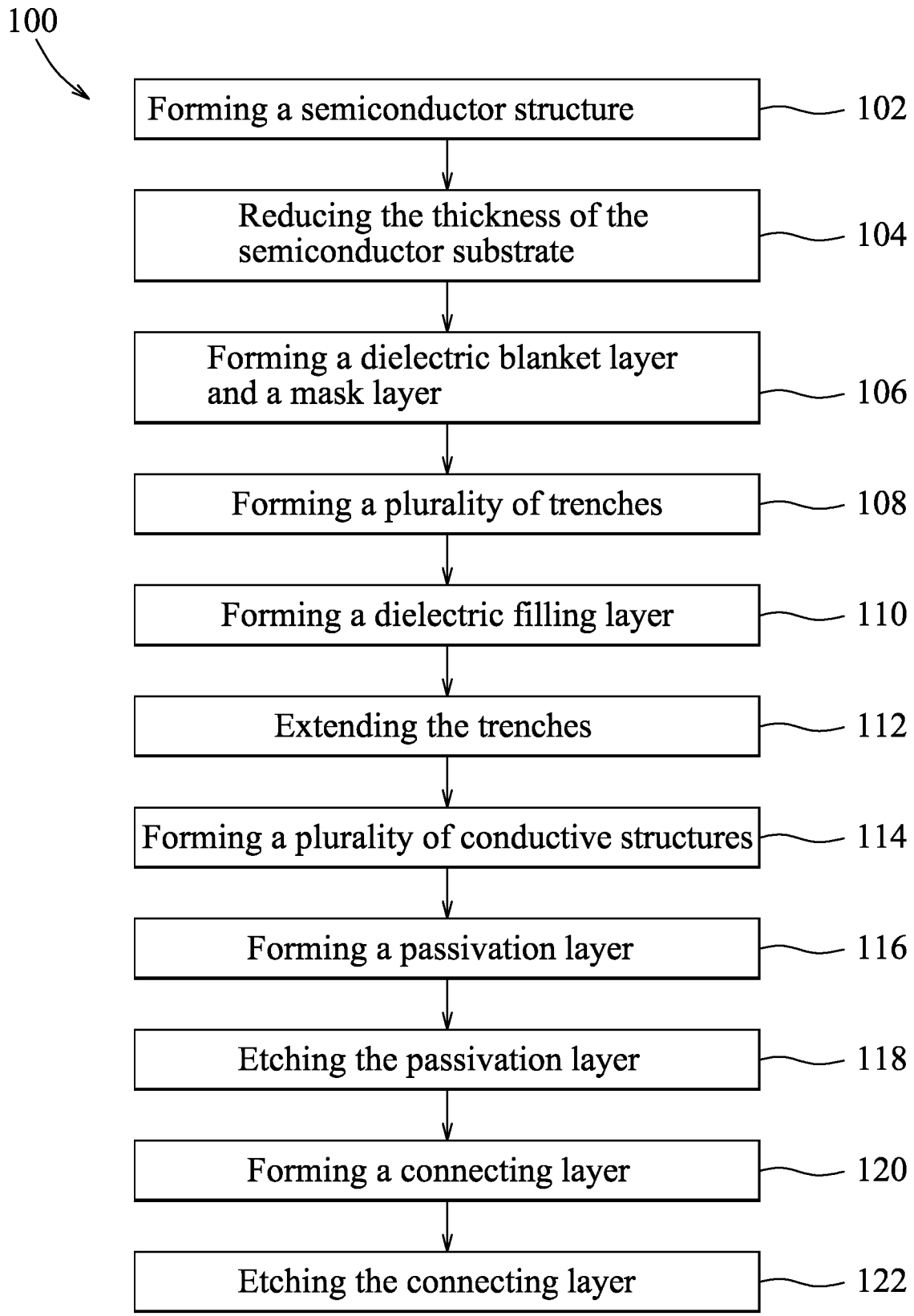
FIG. 1 is a flow chart of a method for manufacturing a semiconductor feature in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor feature 800 (see FIG. 12) in accordance with some embodiments. FIGS. 2 to 17 are schematic views showing intermediate stages of the method 100 as depicted in FIG. 1. Additional steps which are not limited to those described in the method 100, can be provided before, after or during manufacturing of the semiconductor feature 800, and some of the steps described herein may be replaced by other steps or be eliminated. Similarly, additional features may be present in the semiconductor feature 800, and/or features present may be replaced or eliminated in additional embodiments.

Referring to FIG. 1, the method 100 begins at block 102, where a semiconductor structure is formed. Referring to the example illustrated in FIG. 2, the semiconductor structure 200 includes a semiconductor substrate 202, a dielectric structure 204 disposed on the semiconductor substrate 202, a semiconductor device 300 disposed on the semiconductor substrate 202, an isolation feature 400 formed in the semiconductor substrate 202 and surrounding the semiconductor device 300, and an interconnecting structure 500 formed in the dielectric structure 204 and being electrically connected to the semiconductor device 300.

In accordance with some embodiments of the present disclosure, the semiconductor substrate 202 may be a bulk semiconductor substrate made of elemental semiconductor or compound semiconductor. The elemental semiconductor may contain a single species of atoms, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or other suitable materials. In some embodiments, the composition of the compound semiconductor may change from one ratio at one location to another ratio at a different location (i.e., the compound semiconductor may have a gradient composition).

Figure 2:
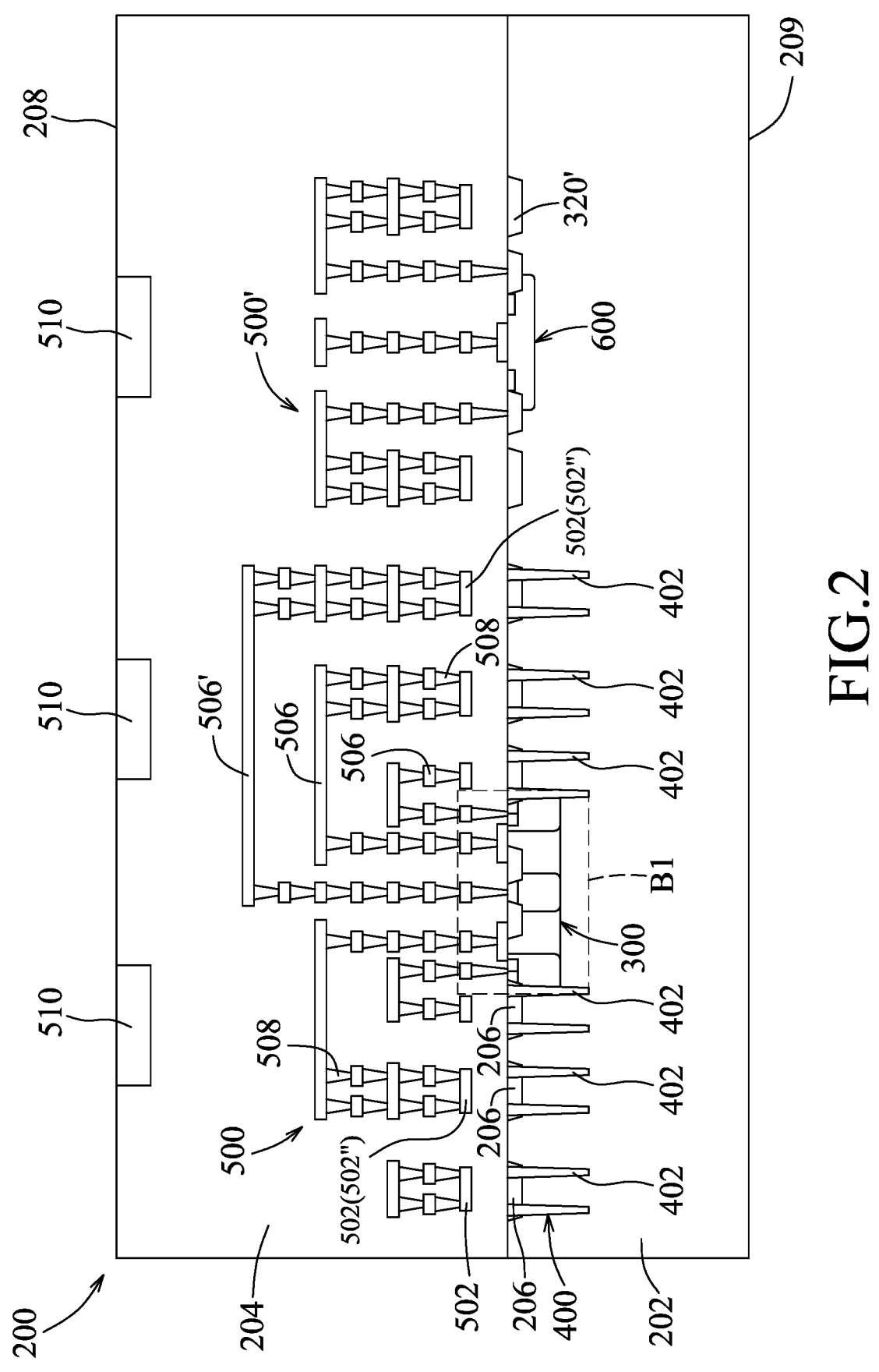
Figure 3:
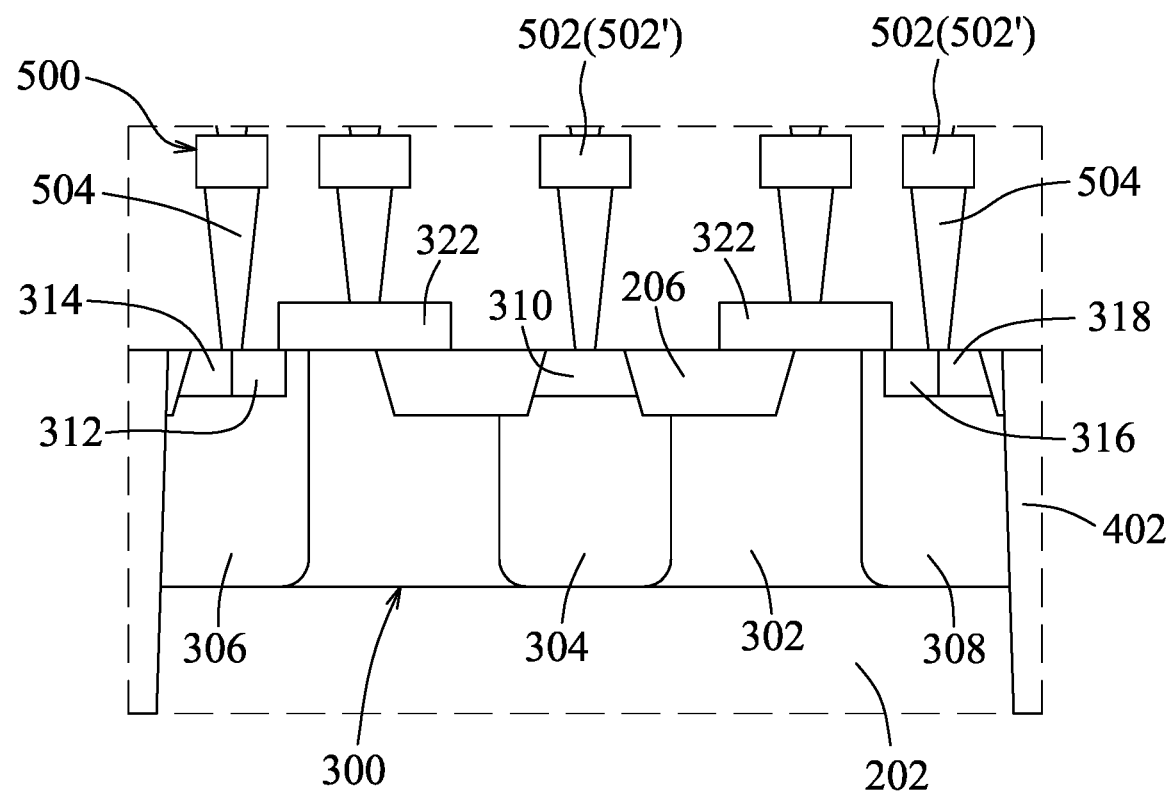

FIG. 3 is an enlarged view taken from the dotted box (B1) in FIG. 2, and schematically shows the semiconductor device 300 along with a portion of the interconnecting structure 500. In accordance with some embodiments of the present disclosure, the semiconductor device 300 is exemplified as an N-type lateral diffusion metal oxide semiconductor (NLDMOS) which may be used as a BIPOLAR-CMOS-DMOS (BCD) power device with a high operation voltage (e.g., about 20 V to about 120 V (e.g., about 100 V), but other ranges of voltage values are also possible), but other types of semiconductor devices are also within the scope of this disclosure. In some embodiments, the semiconductor device 300 includes a first N-well 302, a second N-well 304 formed in the first N-well 302, a first P-well 306 formed in the first N-well 302, a second P-well 308 formed in the first N-well 302, a drain region 310 formed in the second N-well 304, first and second source regions 312, 316 respectively formed in the first and second P-wells 306, 308, and first and second bulk regions 314, 318 respectively formed in the first and second P-wells 306, 308. In some embodiments, the semiconductor structure 200 further includes a plurality of shallow trench isolation (STI) structures 206, in which one of the STI structures 206 surrounds the drain region 310 and the remaining STI structures 206 surround the one of the STI structure 206. In some embodiments, the semiconductor device 300 further includes two gate structures 322 that are disposed on the first N-well 302 and the one of the STI structure 206. In some embodiments, the interconnecting structure 500 includes a first group 502' of first metal layers 502 (e.g., lowest-level metal layers) that are disposed in the dielectric structure 204 and that are located above the semiconductor device 300, and a plurality of contacts 504 that are connected between the first group 502' of the first metal layers 502 and the drain region 310, the first and second source regions 312, 316, the first and second bulk regions 314, 318, and the gate structures 322.

Referring to FIGS. 2 and 3, in some embodiments, the drain region 310, the first and second source regions 312, 316, the first and second bulk regions 314, 318, and the gate structures 322 of the semiconductor device 300 may be redirected to a second group 502" of the first metal layers 502 outside of the dotted box (B1) (i.e., spaced apart from the first group 502' of the first metal layers 502) through multiple vias 508 and multiple upper metal layers 506 (e.g., second metal layers, third metal layers, etc.). FIG. 2 schematically only shows seven layers of metal (i.e., the first metal layers 502 to the seventh metal layers 506'), but the number of the metal layers may be less or more according to practical requirements. In addition, the leftmost first metal layer 502 may be redirected to be electrically connected to other components (not shown). In some embodiments, the interconnecting structure 500 further includes multiple top metal layers 510 that may be electrically connected to the remaining metal layers (e.g., the upper metal layers 506) and/or other interconnecting structures not shown in the figures. The connection structures between the upper metal layers 506 and the top metal layers 510 are omitted for the sake of brevity. In some embodiments, the first metal layers 502 are lowest-level metal layers (i.e., bottommost metal layers) that are located adjacent to the semiconductor device 300, and the top metal layers 510 are highest-level metal layers (i.e., topmost metal layers) that are located away from the semiconductor device 300. In some embodiments, the top metal layers 510 may be exposed from a top surface 208 of the dielectric structure 204.

Referring to FIG. 2, in some embodiments, the isolation feature 400 includes a plurality of deep trench isolation (DTI) structures 402 that surround the semiconductor device 300. In some embodiments, each of the STI structures 206 surrounding the semiconductor device 300 (not including the STI structure 206 surrounding the drain region 310 of the semiconductor device 300) is penetrated by corresponding two of the DTI structures 402, which are separated from each other.

Referring to FIG. 2, in some embodiments, the semiconductor structure 200 may further include another semiconductor device 600 that is disposed on the semiconductor substrate 202, that is surrounded by another STI structure 320', and that is electrically connected to another interconnecting structure 500'. In some embodiments, the semiconductor device 600 may be a logic device, other suitable devices, or any combination thereof.

Figure 4:
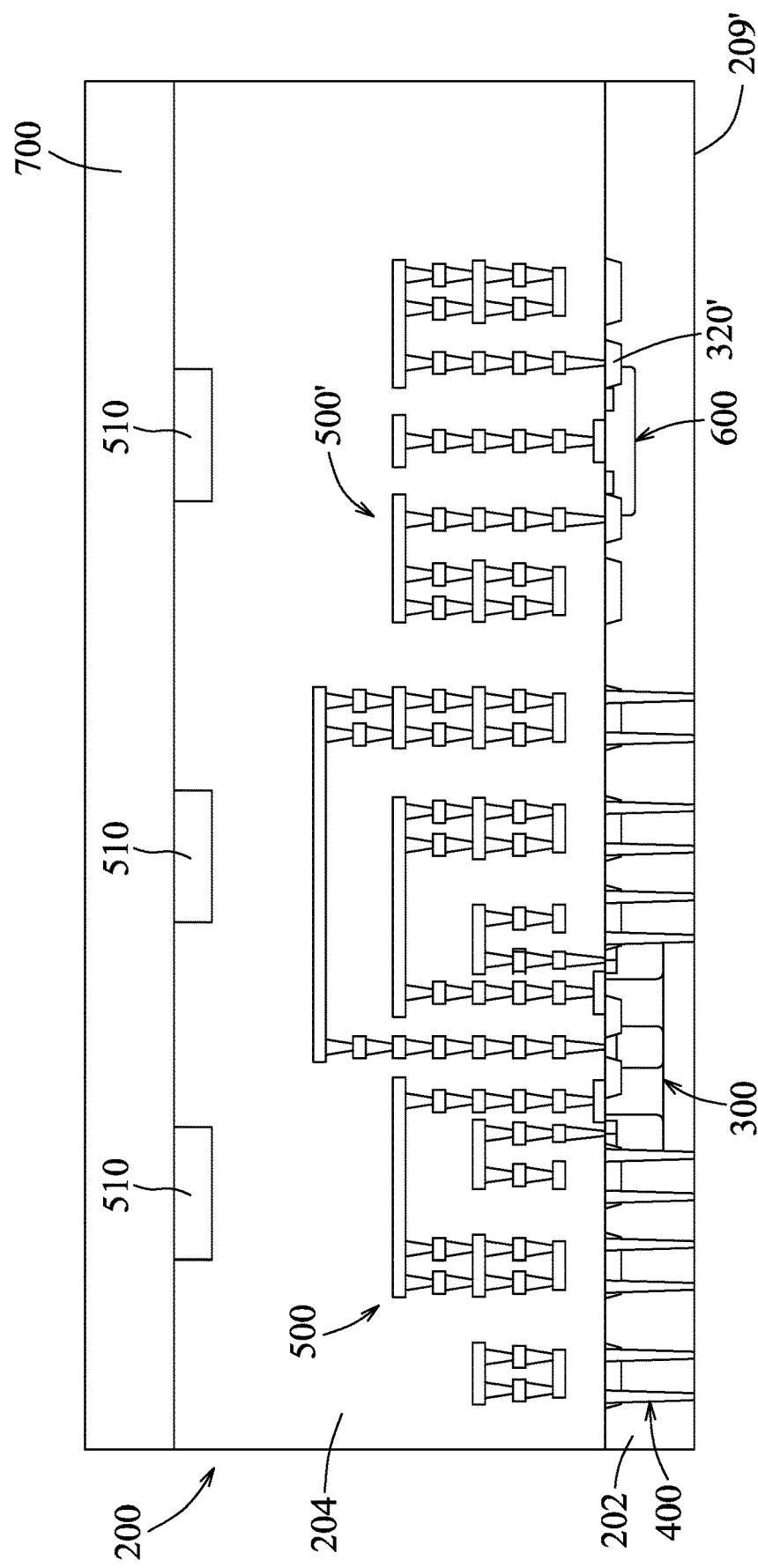

Referring to FIG. 1, the method 100 then proceeds to block 104, where the thickness of the semiconductor substrate is reduced. Referring to FIG. 4, in some embodiments, a carrier wafer 700 may be bonded to the top surface 208 of the dielectric structure 204 (see FIG. 2) and top surfaces of the top metal layers 510, and the thickness of the semiconductor substrate 202 may be reduced by removing a part of the semiconductor substrate 202 from a backside 209 thereof (see FIG. 2) using mechanical polishing, chemical mechanical planarization (CMP), other suitable techniques, or any combination thereof. In some embodiments, the carrier wafer 700 may support the semiconductor structure 200 and/or may be held during the thickness-reducing process. In some embodiments, the thickness-reducing process may be terminated when the isolation feature 400 is exposed from the backside 209' of the semiconductor substrate 202; and, in other embodiments, a lower portion of the isolation feature 400 may be slightly removed.

Figure 5:
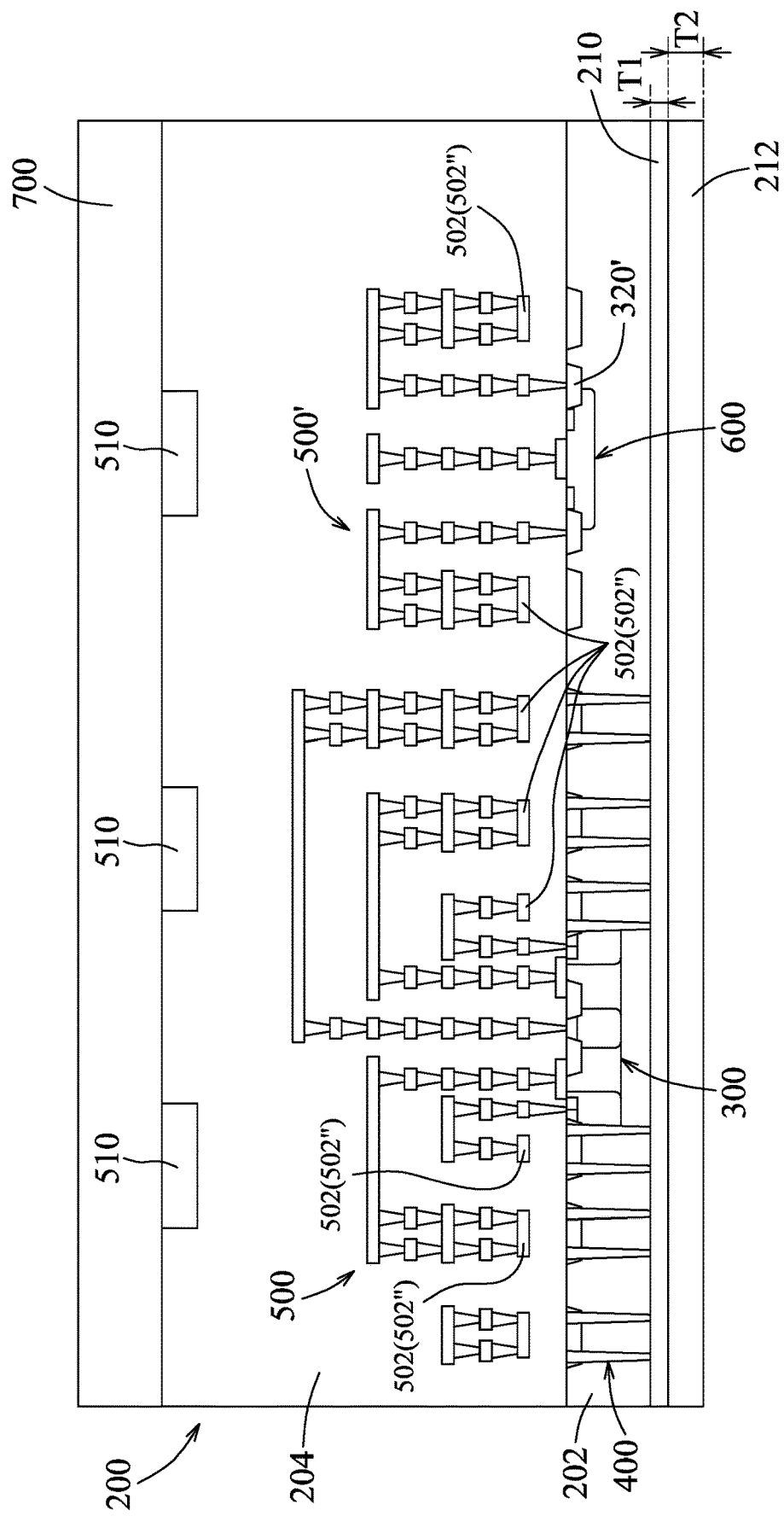

Referring to FIG. 1, the method 100 then proceeds to block 106, where a dielectric blanket layer and a mask layer are formed. Referring to FIG. 5, in some embodiments, the dielectric blanket layer 210 is formed on the backside 209' of the semiconductor substrate 202 (see FIG. 4), and the mask layer 212 is formed on the dielectric blanket layer 210. In some embodiments, each of the dielectric blanket layer 210 and the mask layer 212 may be formed by chemical vapor deposition (CVD), atomic layer deposition (ALD), physical vapor deposition (PVD), other suitable techniques, or any combination thereof. In some embodiments, the dielectric blanket layer 210 may serve to cover the backside 209' of the semiconductor substrate 202, which may contain some defects introduced during the thickness-reducing process. In some embodiments, the dielectric blanket layer 210 may be made of a suitable material, such as a high-k material (e.g., $HfSiO$, $HfO_2$, $Al_2O_3$, $ZrO_2$, $La_2O_3$, $TiO_2$, $Y_2O_3$, $SrTiO_3$, other suitable materials, or any combination thereof). In some embodiments, the dielectric blanket layer 210 may have a thickness (T1) ranging from about 500 Å to about 700 Å, from about 500 Å to about 550 Å, from about 550 Å to about 600 Å, from about 600 Å to about 650 Å, or from about 650 Å to about 700 Å, but other ranges of values are also within the scope of this disclosure. If the thickness of the dielectric blanket layer 210 is too small, such as smaller than about 500 Å, the dielectric blanket layer 210 may not effectively cover the aforementioned defects. If the thickness of the dielectric blanket layer 210 is too large, such as greater than about 700 Å, the overall dimension of the semiconductor feature 800 (see FIG. 12) may be increased, which may be undesirable due to the current trend of device shrinkage. In some embodiments, the mask layer 212 may serve as an etching mask layer for forming a plurality of trenches 214 (see FIG. 6), which will be described hereinafter. In some embodiments, the mask layer 212 may be made of an oxide-based material, such as undoped silicate glass (USG) (formed by low density or high density plasma), other suitable materials, or any combination thereof. In some embodiments, the mask layer 212 may have a thickness (T2) ranging from about 3000 Å to about 5000 Å, from about 3000 Å to about 3600 Å, from about 3600 Å to about 4000 Å, from about 4000 Å to about 4400 Å, or from about 4400 Å to about 5000 Å, but other ranges of values are also within the scope of this disclosure. If the thickness of the mask layer 212 is too small, such as smaller than about 3000 Å, the mask layer 212 may not effectively serve as an etching mask layer, and the shape of the trenches 214 formed by etching may be distorted. If the thickness of the mask layer 212 is too large, such as greater than about 5000 Å, the overall dimension of the semiconductor feature 800 (see FIG. 12) may be increased, which may be undesirable due to the current trend of device shrinkage. In some embodiments, the processes after FIG. 4 may be conducted with the carrier wafer 700 and the semiconductor structure 200 being turned upside down. However, FIGS. 5, 6, 8, 10, 12, 14, 15, 16 and 17 still show the carrier wafer 700 and the semiconductor structure 200 not being turned, to be consistent with FIGS. 2 and 4.

Figure 6:
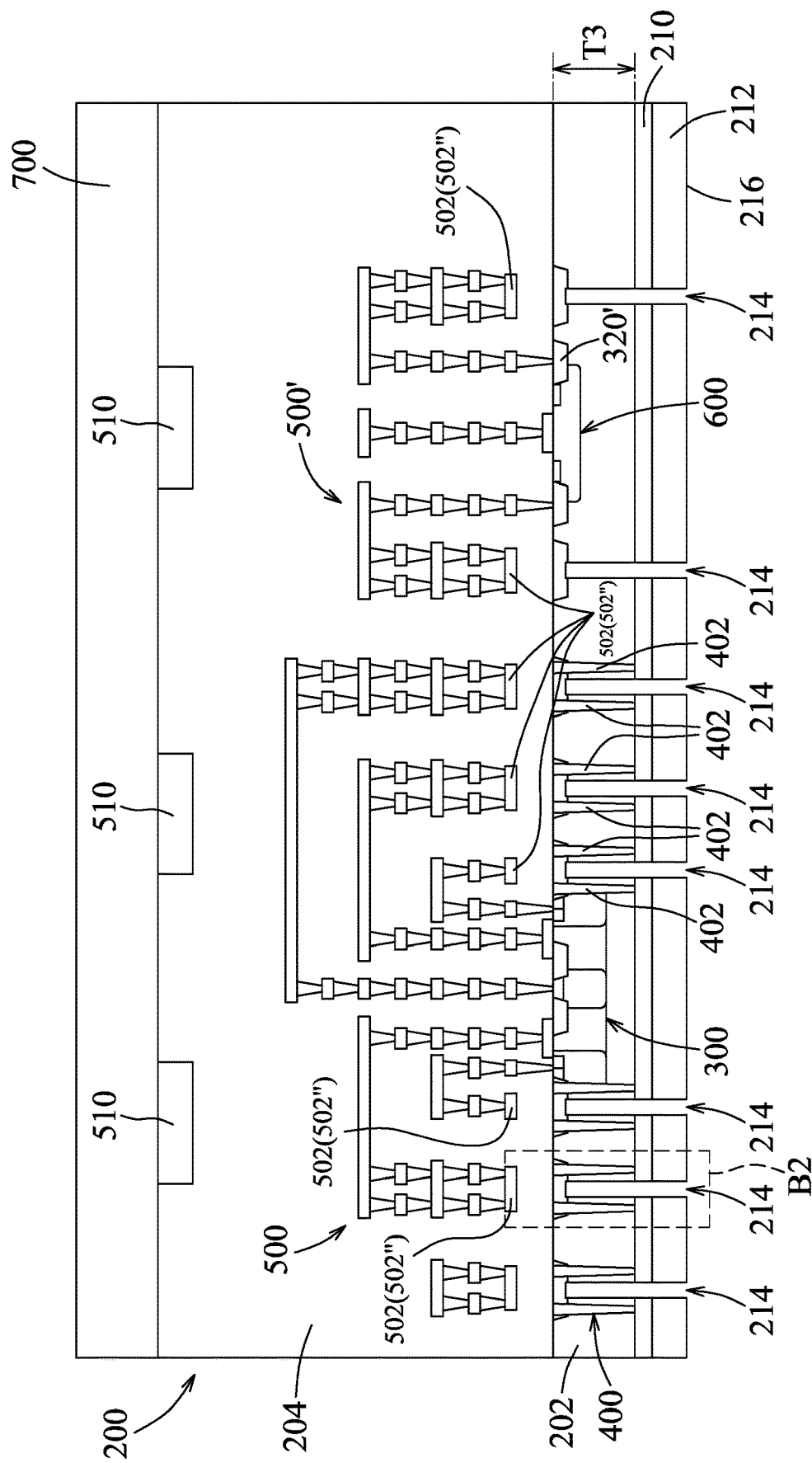
Figure 7:
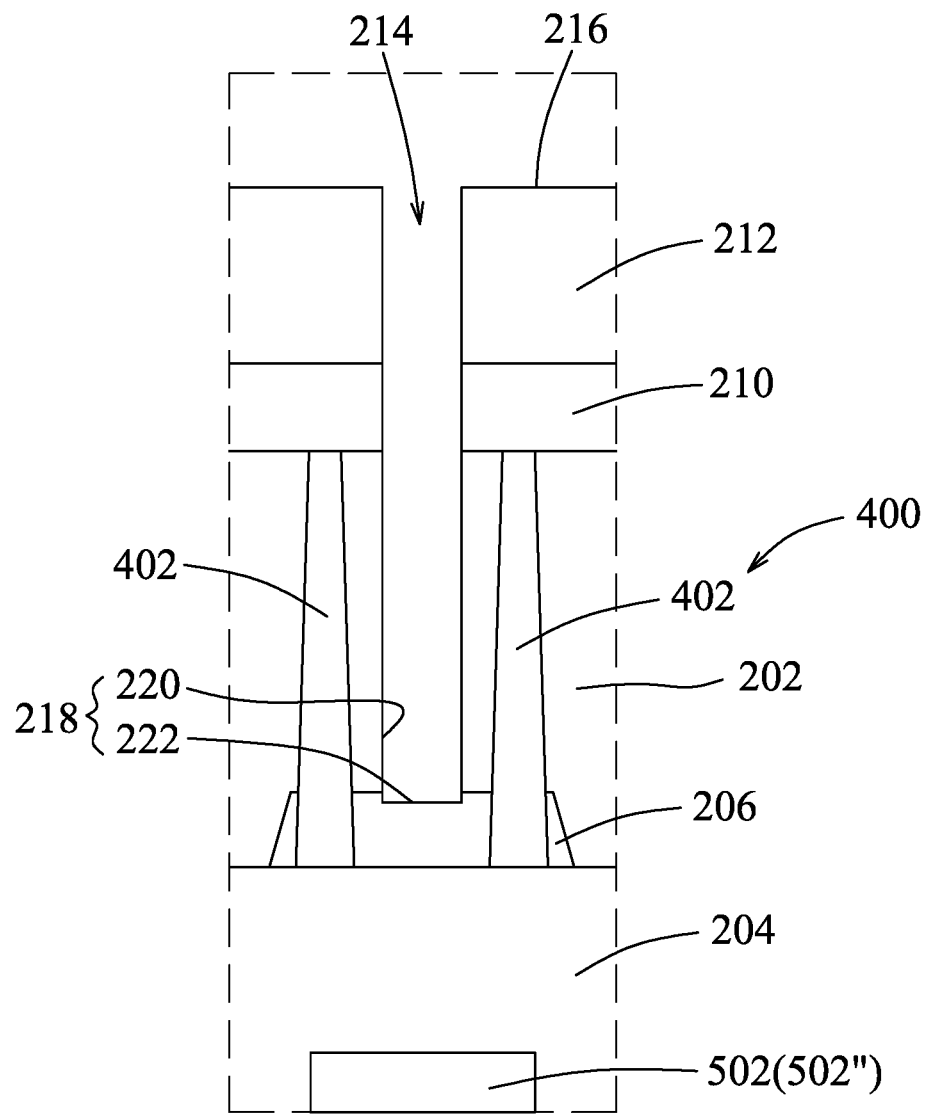

Referring to FIG. 1, the method 100 then proceeds to block 108, where a plurality of the trenches are formed. Referring to FIG. 6, in some embodiments, each of the trenches 214 corresponding to the semiconductor device 300 is disposed beneath a corresponding one of the STI structures 206, and is disposed between corresponding two of the DTI structures 402 that penetrate the corresponding one of the STI structures 206. Each of the trenches 214 corresponds in position to a corresponding one of the first metal layers 502. The number and position of the trenches 214 may be changed according to practical requirements. In some embodiments, a photoresist layer (not shown) may be formed on a backside 216 of the mask layer 212 to serve as an etching mask for etching the mask layer 212, followed by using the etched mask layer 212 as an etching mask to etch the dielectric blanket layer 210 and the semiconductor substrate 202 using a suitable technique (e.g., plasma dry etching, etc.), thereby forming the trenches 214. The trenches 214 penetrate the mask layer 212 and the dielectric blanket layer 210 and into the semiconductor substrate 202 to expose the STI structures 206. In some embodiments, the semiconductor substrate 202 shown in FIG. 6 may have a thickness (T3) ranging from about 5 μm to about 10 μm, from about 5 μm to about 7 μm, or from about 7 μm to about 10 μm, but other ranges of values are also within the scope of this disclosure. If the thickness (T3) of the semiconductor substrate 202 is too small, such as smaller than about 5 μm, there might be insufficient capability of dissipating heat from the semiconductor feature 800 (see FIG. 12). If the thickness (T3) of the semiconductor substrate 202 is too large, such as greater than about 10 μm, each of the trenches 214 may have a high aspect ratio, which may be difficult to obtain by etching techniques (e.g., plasma dry etching, etc.). In addition, the high aspect ratio feature of the trenches 214 may make it difficult to fill the trenches 214 with conductive materials, which will be described hereinafter. FIG. 7 is an enlarged view taken from a dotted box (B2) in FIG. 6 and is turned upside down. As shown in FIG. 7, in some embodiments, the trench 214 formed by the etching process terminates at the STI structure 206; and, in other embodiments, the trench 214 may slightly extend into the STI structure 206. In some embodiments, as shown in FIG. 7, the trench 214 may be defined by a trench-defining wall 218, which includes a side wall portion 220 and a bottom wall portion 222. In some embodiments, the side wall portion 220 may be defined by the semiconductor substrate 202, the dielectric blanket layer 210 and the mask layer 212, and the bottom wall portion 222 may be defined by the STI structure 206.

Figure 8:
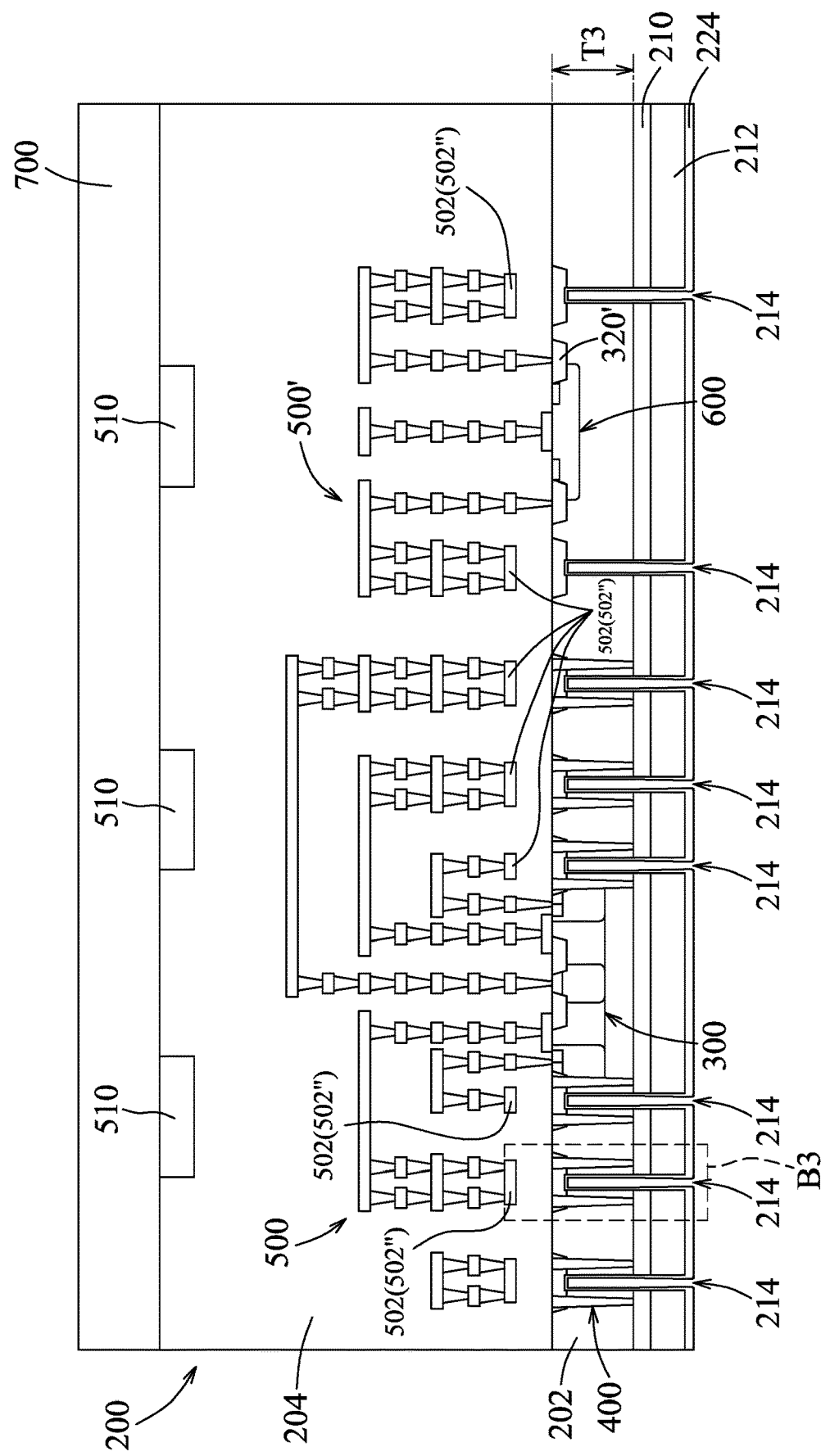
Figure 9:
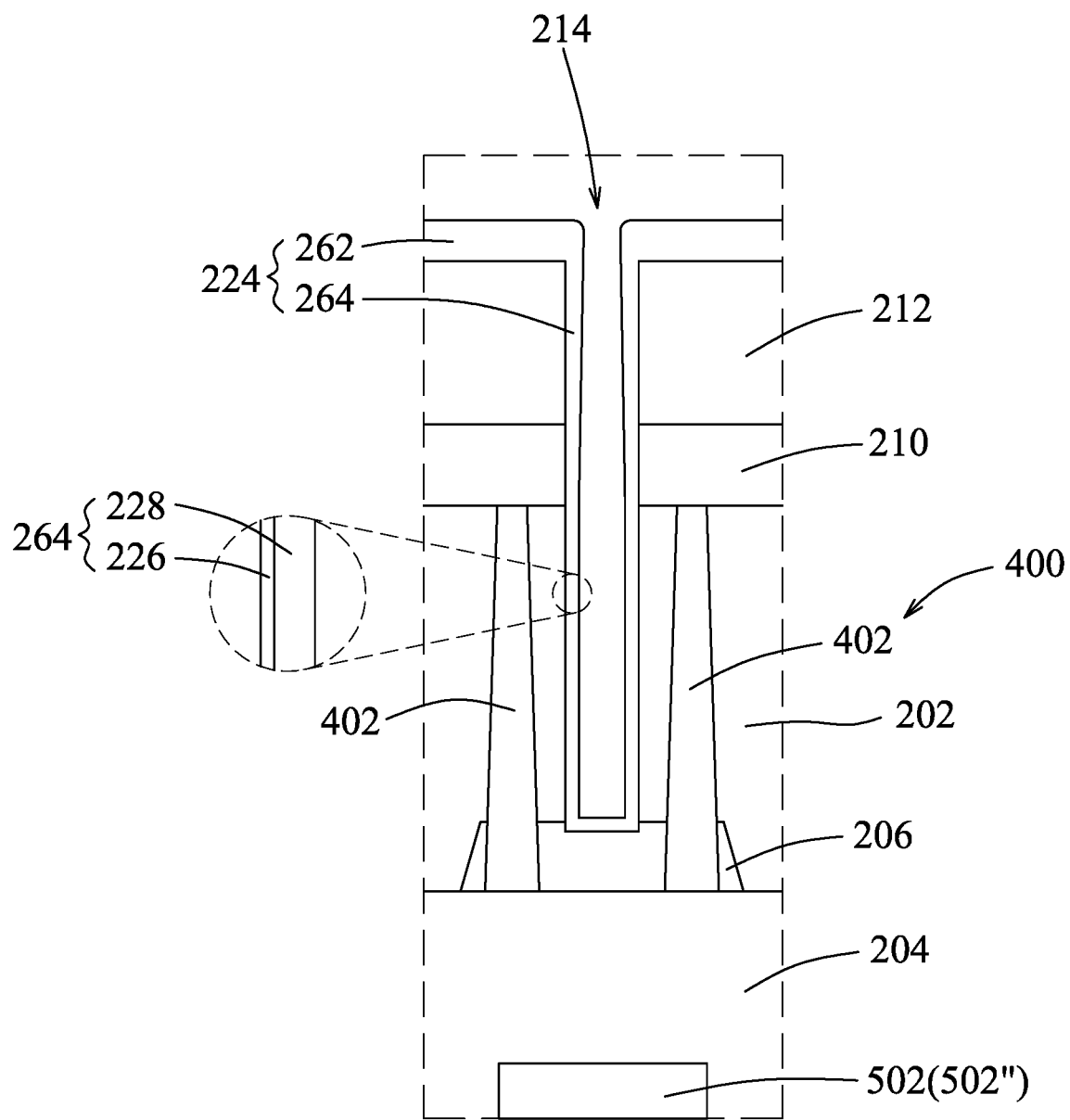

Referring to FIG. 1, the method 100 then proceeds to block 110, where a dielectric filling layer is formed. Referring to FIG. 8, in some embodiments, the dielectric filling layer 224 is formed on the backside 216 of the mask layer 212 (see FIG. 6) and in the trenches 214. In some embodiments, the dielectric filling layer 224 may be formed using CVD, ALD, PVD, other suitable techniques, or any combination thereof. FIG. 9 is an enlarged view taken from a dotted box (B3) in FIG. 8 and is turned upside down. In some embodiments, as shown in FIG. 9, the dielectric filling layer 224 is formed on the backside 216 of the mask layer 212 (see FIG. 7), and on the trench-defining wall 218 (see FIG. 7), including the side wall portion 220 and the bottom wall portion 222. In some embodiments, the dielectric filling layer 224 may include a first portion 262 that is formed on the backside 216 of the mask layer 212, and a second portion 264 that is formed on the trench-defining wall 218. In some embodiments, since the second portion 264 of the dielectric filling layer 224 is formed in the trench 214, the thickness of the second portion 264 may be smaller than the thickness of the first portion 262 of the dielectric filing layer 224. In some embodiments, each of the first and second portions 262, 264 of the dielectric filling layer 224 may include a first sub-layer 226 disposed on the backside 216 of the mask layer 212 and the trench-defining wall 218, and a second sub-layer 228 disposed on the first sub-layer 226. In some embodiments, the first sub-layer 226 may be made of an oxide-based material, such as silicon-oxide-based materials (e.g., $SiO_2$), other suitable materials, or any combination thereof. In some embodiments, the second sub-layer 228 may be made of a nitride-based material, such as silicon-nitride-based materials (e.g., $Si_3N_4$), other suitable materials, or any combination thereof. In some embodiments, the first sub-layer 226 may have a thickness ranging from about 400 Å to about 600 Å, from about 400 Å to about 450 Å, from about 450 Å to about 500 Å, from about 500 Å to about 550 Å, or from about 550 Å to about 600 Å, but other ranges of values are also within the scope of this disclosure. In some embodiments, the second sub-layer 228 may have a thickness ranging from about 1000 Å to about 2000 Å, from about 1000 Å to about 1350 Å, from about 1350 Å to about 1500 Å, from about 1500 Å to about 1650 Å, or from about 1650 Å to about 2000 Å, but other ranges of values are also within the scope of this disclosure. In some embodiments, the first sub-layer 226 may serve as a barrier or a spacer for the subsequently formed conductive structure 240 (see FIG. 13) (e.g., a backside through-substrate via (BTSV)), which will be described more specifically hereinafter. If the thickness of the first sub-layer 226 is too small, such as less than about 400 Å, the first sub-layer 226 may fail to serve as a barrier/spacer layer. If the thickness of the first sub-layer 226 is too large, such as greater than about 600 Å, the first sub-layer 226 may occupy too much space of the trench 214, making it difficult to form the conductive structure 240 in the trench 214 or causing the conductive structure 240 to have high resistance since the overall volume of the conductive structure 240 is reduced. In some embodiments, the second sub-layer 228 may serve as a filler which may improve the uniformity of the trench 214, allowing the conductive structure 240 to be formed with less defects in the trench 214 and with better adhesion to the STI structure 206, the semiconductor substrate 202, the dielectric blanket layer 210 and the mask layer 212. If the thickness of the second sub-layer 228 is too small, such as less than about 1000 Å, the second sub-layer 228 may fail to serve as a filler. If the thickness of the second sub-layer 228 is too large, such as greater than about 2000 Å, the second sub-layer 228 may occupy too much space of the trench 214, making it difficult to form the conductive structure 240 in the trench 214 or causing the conductive structure 240 to have high resistance since the overall volume of the conductive structure 240 is reduced.

Figure 10:
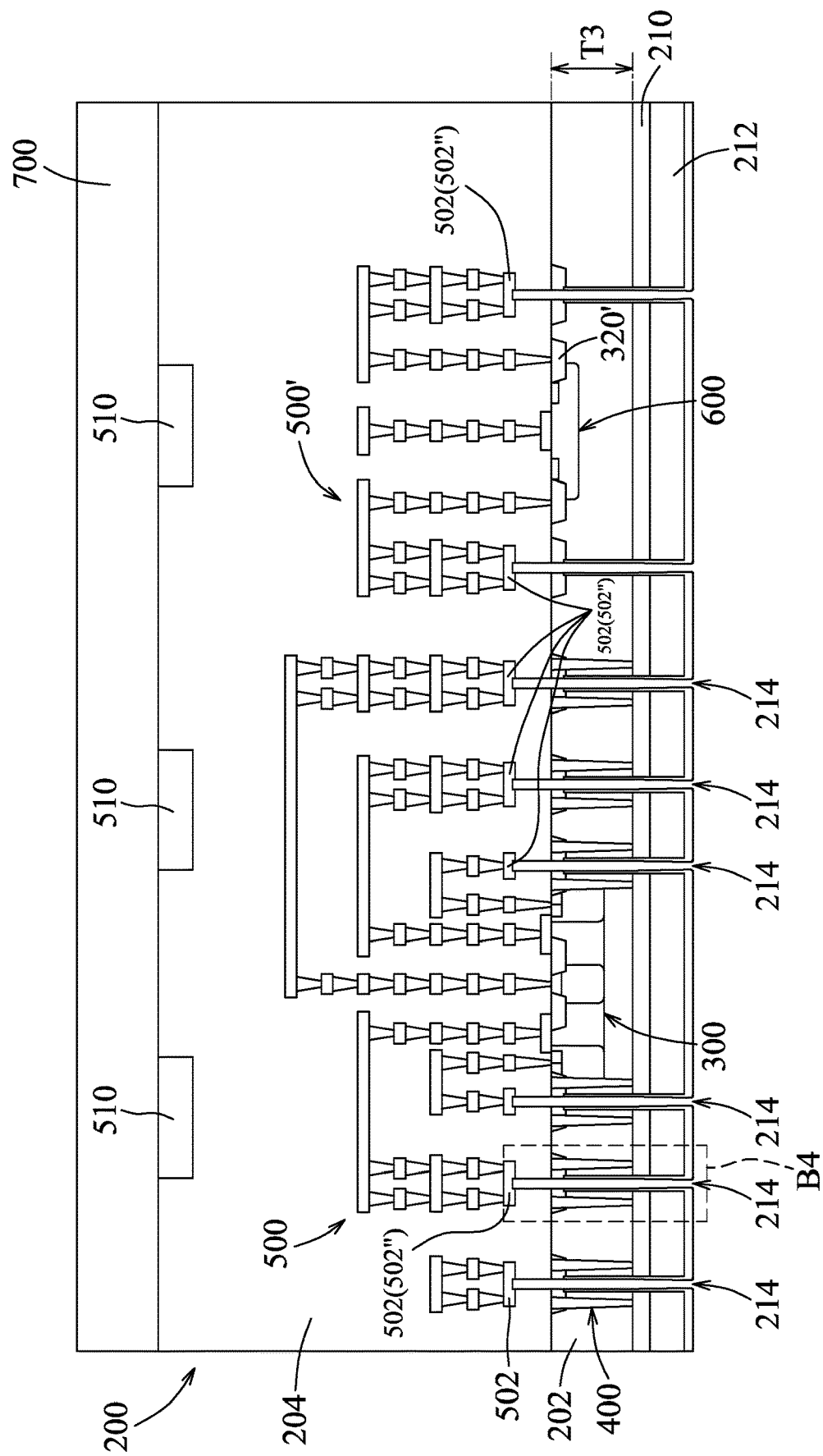
Figure 11:
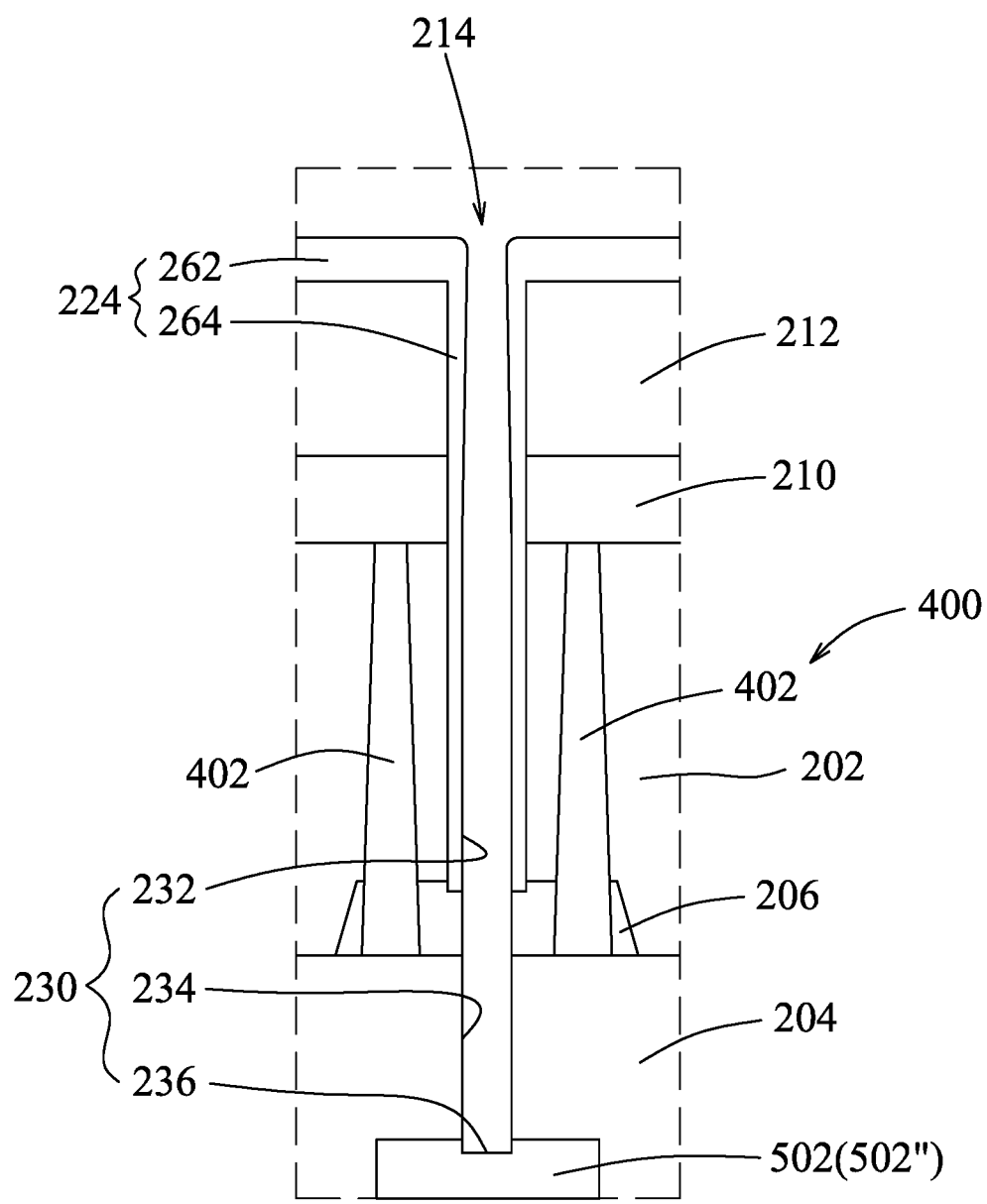

Referring to FIG. 1, the method 100 then proceeds to block 112, where the trenches are extended. Referring to FIG. 10, the trenches 214 are extended into the first metal layers 502 using a suitable technique (e.g., plasma dry etching, etc.). FIG. 11 is an enlarged view taken from a dotted box (B4) in FIG. 10 and is turned upside down. In some embodiments, as shown in FIG. 11, the trench 214 is extended to the first metal layer 502 with the second portion 264 of the dielectric filling layer 224 on the bottom wall portion 222 of the trench-defining wall 218 (see FIGS. 7 and 9) being removed by the etching process; and, in other embodiments, the trench 214 slightly extends into the first metal layer 502. In some embodiments, as shown in FIG. 11, the trench 214 is defined by a trench-defining wall 230, which includes a first portion 232, a second portion 234 connected to the first portion 232, and a third portion 236 connected to the second portion 234. In some embodiments, the first portion 232 is defined by the second portion 264 of the dielectric filling layer 224 (see FIG. 9) formed on the side wall portion 220 of the trench-defining wall 218 (se FIG. 7), the second portion 234 is defined by the STI structure 206 and the dielectric structure 204, and the third portion 236 is defined by the first metal layer 502.

Figure 12:
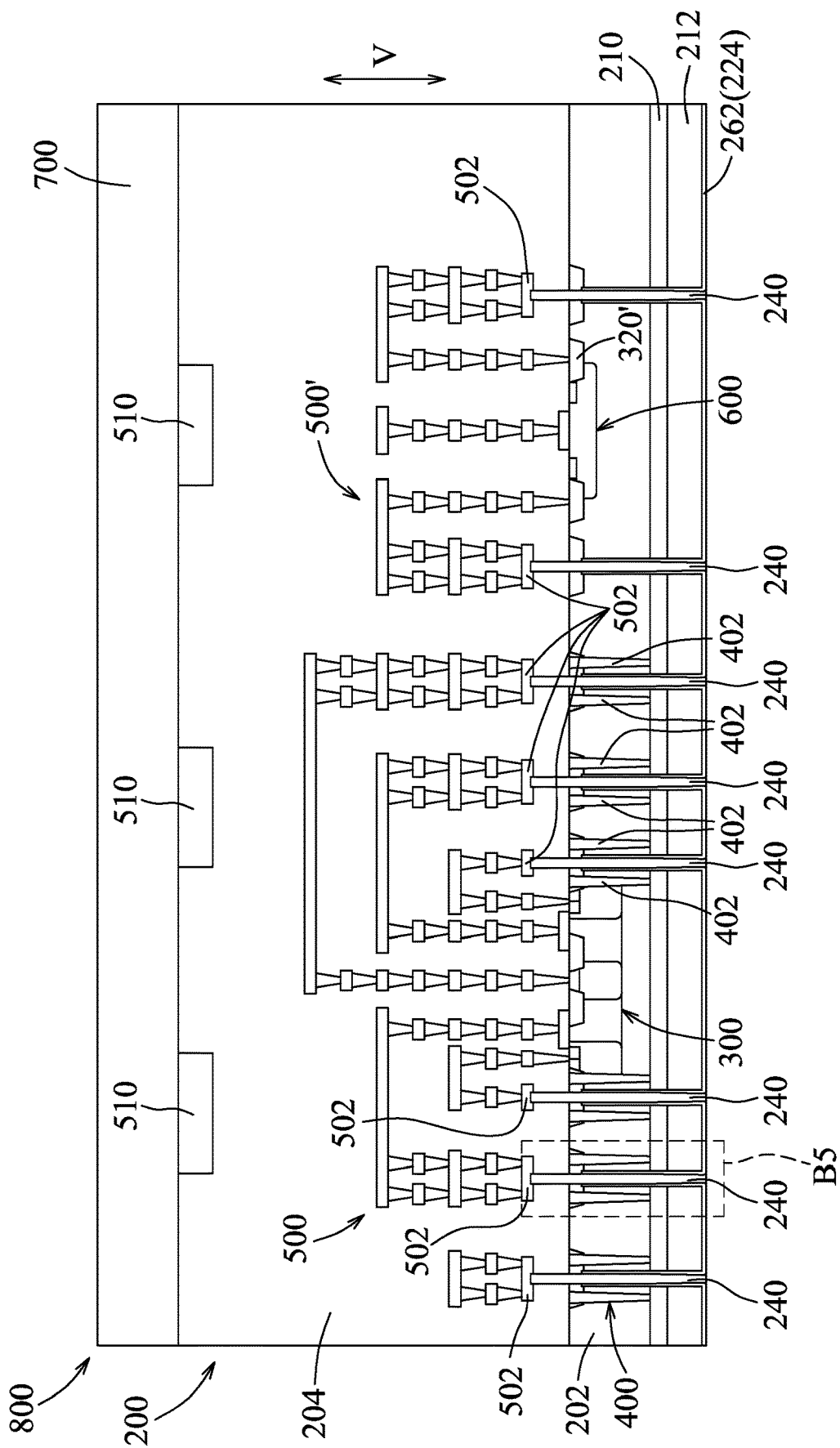

Referring to FIG. 1, the method 100 then proceeds to block 114, where a plurality of the conductive structures are formed. Referring to FIG. 12, a conductive material is first formed on the trench-defining wall 230 and the dielectric filling layer 224 to fill the trenches 214 (see FIG. 10), and the conductive material outside of the trenches 214 (i.e., the conductive material on the first portion 262 of the dielectric filling layer 224) is removed to form the conductive structures 240 respectively disposed on the trenches 214, thereby obtaining the semiconductor feature 800. In some embodiments, the first portion 262 of the dielectric filling layer 224 may be slightly removed during removal of the conductive material (i.e., the thickness of the dielectric filling layer 224 on the backside 216 of the mask layer 212 (see FIG. 6) may be slightly reduced). In some embodiments, the conductive material may be formed using ALD, CVD, PVD, plating, other suitable techniques, or any combination thereof. In some embodiments, the conductive material may be Cu, W, other suitable materials, or any combination thereof. In other words, the conductive structures 240 may be made of Cu, W, other suitable materials, or any combination thereof.

In some embodiments, as shown in FIG. 12, the semiconductor feature 800 includes the semiconductor substrate 202, the dielectric structure 204 disposed on the semiconductor substrate 202, the dielectric blanket layer 210 disposed on the semiconductor substrate 202 opposite to the dielectric structure 204, and the mask layer 212 disposed on the dielectric blanket layer 210. In some embodiments, the semiconductor feature 800 further includes the dielectric filling layer 224 which includes the first portion 262 disposed on the mask layer 212. In some embodiments, the semiconductor feature 800 further includes the semiconductor device 300 disposed on the semiconductor substrate 202, the another semiconductor device 600 disposed on the semiconductor substrate 202, the interconnecting structure 500 disposed in the dielectric structure 204 and electrically connected to the semiconductor device 300, and the another interconnecting structure 500' disposed in the dielectric structure 204 and electrically connected to the another semiconductor device 600. In some embodiments, the semiconductor feature 800 further includes the carrier wafer 700 that is connected to the top surface 208 of the dielectric structure 204 (see FIG. 2) and top surfaces of the top metal layers 510 of the interconnecting structure 500. In some embodiments, the semiconductor feature 800 further includes the another STI structure 320' surrounding the another semiconductor device 600, and a plurality of the STI structures 206 (three are exemplified in FIG. 12, but other numbers are also possible in other embodiments) that are formed in the semiconductor substrate 202, and that surround the semiconductor device 300. In some embodiments, each of the STI structures 206 corresponds in position to corresponding one of the first metal layers 502 in a direction (V), which may be substantially perpendicular to a horizontal surface of the semiconductor substrate 202 in some embodiments. In some embodiments, each of the STI structures 206 is aligned with the corresponding one of the first metal layers 502 in the direction (V). In some embodiments, the semiconductor feature 800 further includes the isolation feature 400, which includes a plurality of the DTI structures 402. In some embodiments, the DTI structures 402 are formed in the semiconductor substrate 202 and the STI structures 206. In some embodiment, each of the DTI structures 402 penetrates the semiconductor substrate 202 and a corresponding one of the STI structures 206. In some embodiments, the semiconductor feature 800 further includes a plurality of the conductive structures 240 that are formed in the mask layer 212, the dielectric blanket layer 210, the semiconductor substrate 202, the STI structures 206 (or the another STI structure 320') and the dielectric structure 204, and that are electrically connected to the first metal layers 502. In some embodiments, each of the conductive structures 240 penetrates the mask layer 212, the dielectric blanket layer 210, the semiconductor substrate 202, a corresponding one of the STI structures 206 (or the another STI structure 320'), into the dielectric structure 204 to be electrically connected to a corresponding one of the first metal layers 502. In some embodiments, each of the conductive structures 240 is disposed between corresponding two of the DTI structures 402 (see left side of the semiconductor feature 800 in FIG. 12).

Figure 13:
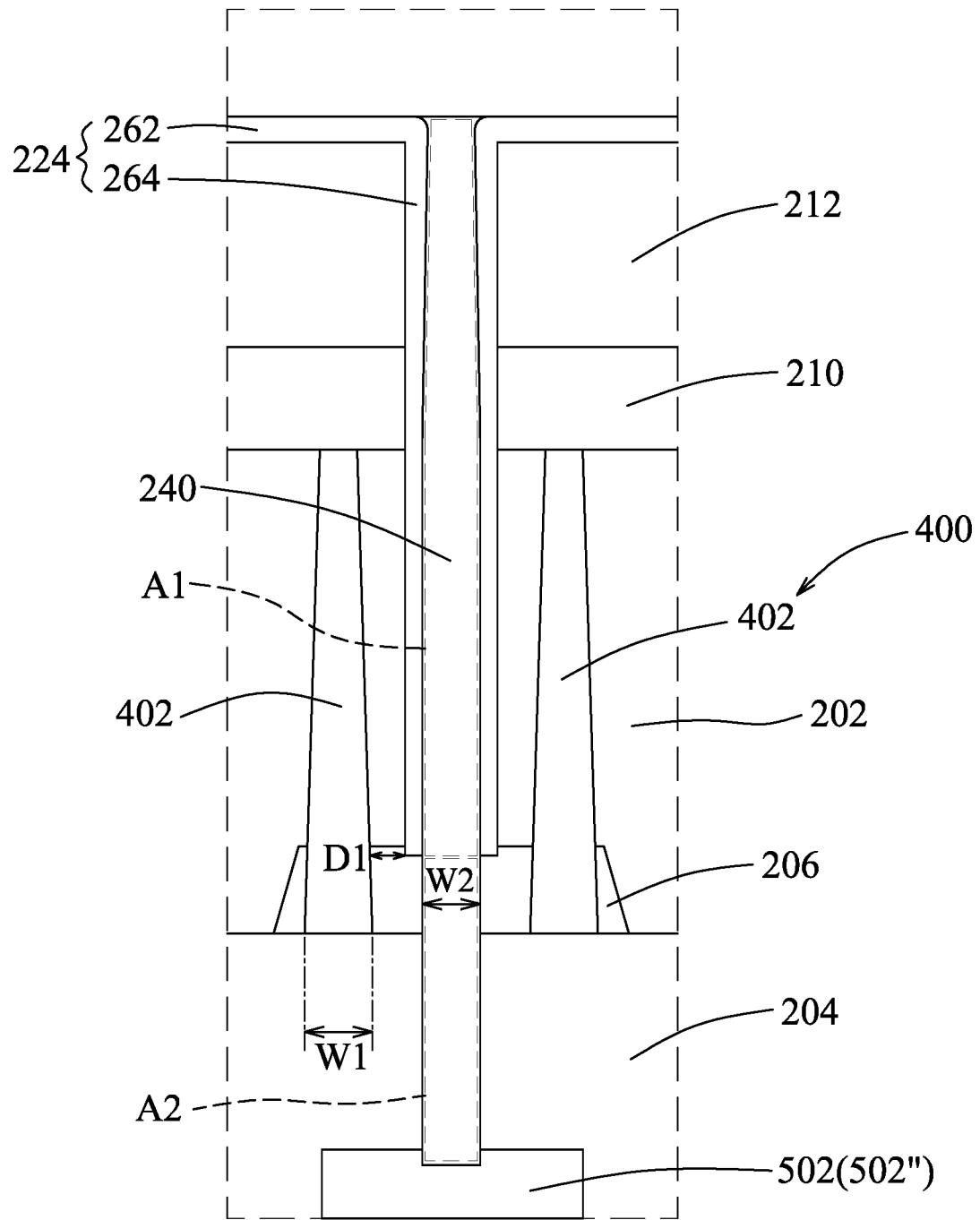

FIG. 13 is an enlarged view taken from a dotted box (B5) in FIG. 12 and is turned upside down. In some embodiments, as shown in FIG. 13, the conductive structure 240 penetrates the mask layer 212, the dielectric blanket layer 210, the semiconductor substrate 202, the STI structure 206, and extends into the dielectric structure 204 to be electrically connected to the first metal layers 502. In some embodiments, the conductive structure 240 may partially extend into the first metal layers 502. In some embodiments, the conductive structure 240 is disposed between the DTI structures 402, and is surrounded by one of the DTI structures 402. In some embodiments, the conductive structure 240 has a first portion (A1) (e.g., a lower portion) that is surrounded by the second portion 264 of the dielectric filling layer 224. The conductive structure 240 further has a second portion (A2) (e.g., an upper portion) that is disposed between the first portion (A1) and the first metal layers 502, that is outside of the dielectric filling layer 224 (i.e., that is not surrounded by the second portion 264 of the dielectric filling layer 224), and that is surrounded by the STI structure 206 and the dielectric structure 204. In some embodiments, each of the DTI structures 402 may have a maximum width (W1) ranging from about 0.6 µm to about 1.2 µm, from about 0.6 µm to about 0.8 µm, from about 0.8 µm to about 1 µm, or from about 1 µm to about 1.2 µm, but other ranges of values are also within the scope of this disclosure. If the maximum width (W1) of each of the DTI structures 402 is too small, such as smaller than about 0.6 µm, the DTI structure 402 may not be able to protect the semiconductor device 300 (see FIG. 12) (e.g., a leakage current flowing through the DTI structure 402 may damage the semiconductor device 300 or other components not shown in the figure). If the maximum width (W1) of each of the DTI structures 402 is too large, such as greater than about 1.2 µm, the overall dimension of the semiconductor feature 800 (see FIG. 12) may be undesirably increased, and the production cost will be higher since a larger amount of material is needed to form the DTI structure 402. In some embodiments, the conductive structure 240 has a maximum width (W2) ranging from about 3.5 µm to about 4.5 µm, from about 3.5 µm to about 3.8 µm, from about 3.8 µm to about 4 µm, from about 4 µm to about 4.2 µm, or from about 4.2 µm to about 4.5 µm, but other ranges of values are also within the scope of this disclosure. If the maximum width (W2) of the conductive structure 240 is too small, such as smaller than about 3.5 µm, the electrical resistance may be too high. If the maximum width (W2) of the conductive structure 240 is too large, such as greater than about 4.5 µm, the overall dimension of the semiconductor feature 800 (see FIG. 12) may be undesirably increased, and the production cost will be higher since a larger amount of material is needed to form the conductive structure 240. In some embodiments, a minimum distance (D1) between the dielectric filling layer 224 or the conductive structure 240 and one of the adjacent DTI structures 402 may range from about 0.5 μm to about 1 μm, from about 0.5 μm to about 0.6 μm, from about 0.6 μm to about 0.7 μm, from about 0.7 μm to about 0.8 μm, from about 0.8 μm to about 0.9 μm, or from about 0.9 μm to about 1 μm, but other ranges of values are also within the scope of this disclosure. If the minimum distance (D1) between the dielectric filling layer 224 or the conductive structure 240 and one of the adjacent DTI structures 402 is too small (i.e., a minimum distance between the trench 214 (see FIG. 11) and one of the adjacent DTI structures 402), such as smaller than about 0.5 μm, the one of the adjacent DTI structures 402 may be etched during the process of forming the trench 214, which may cause the dimension of the trench 214 to be non-uniform since the DTI structures 402 are harder to etch compared with the semiconductor substrate 202. If the minimum distance (D1) between the dielectric filling layer 224 or the conductive structure 240 and one of the adjacent DTI structures 402 is too large, such as greater than about 1 μm, the overall dimension of the semiconductor feature 800 (see FIG. 12) may be undesirably increased.

Figure 14:
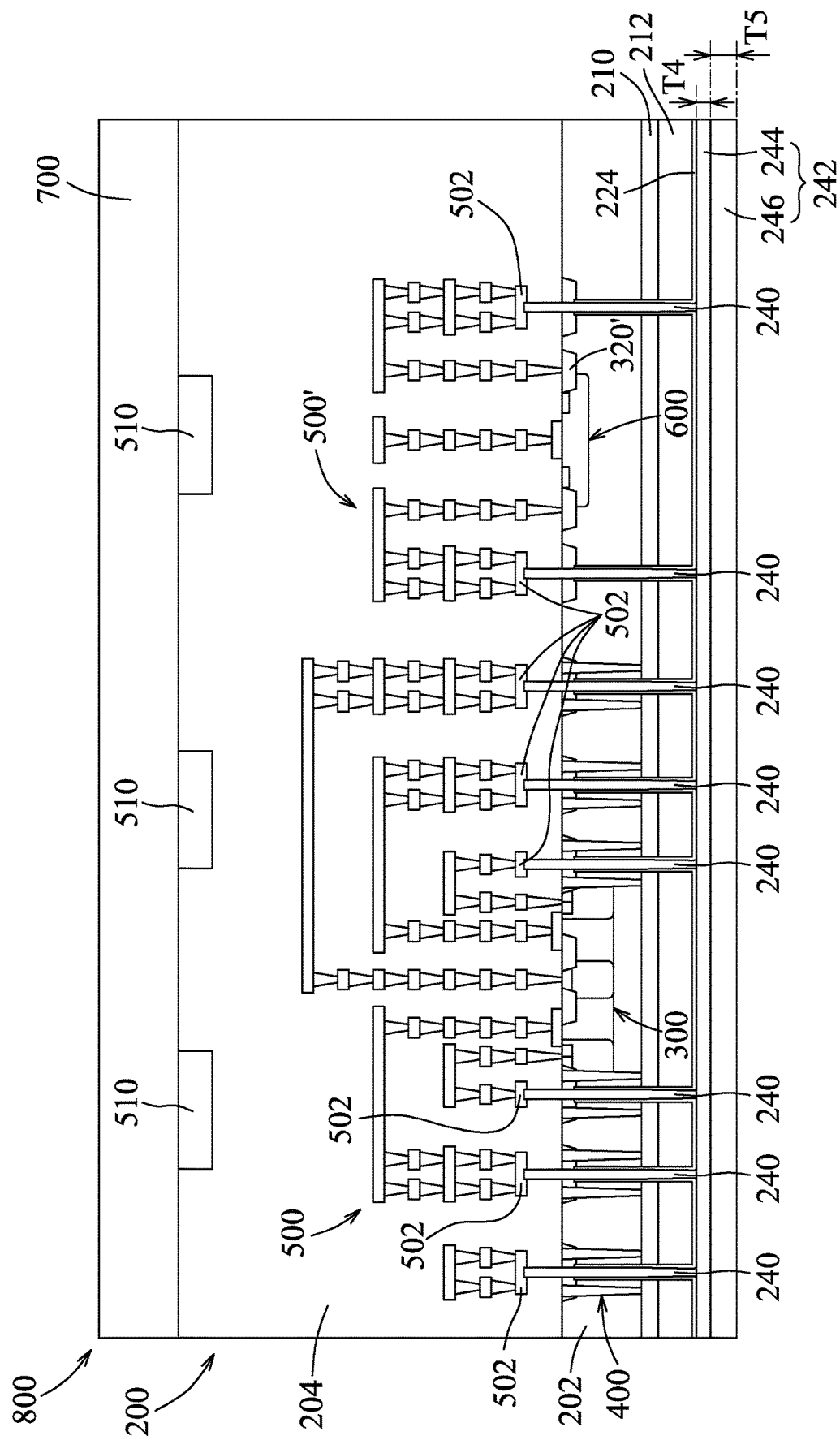

Referring to FIG. 1, the method 100 then proceeds to block 116, where a passivation layer is formed. Referring to FIG. 14, in some embodiments, the passivation layer 242 is disposed on the first portion 262 of the dielectric filling layer 224 (see FIG. 12), and may include a first passivation sub-layer 244 disposed on the first portion 262 of the dielectric filling layer 224 and a second passivation sub-layer 246 disposed on the first passivation sub-layer 244. In some embodiments, the first passivation sub-layer 244 may be made of a nitride-based material, such as silicon nitride, other suitable materials, or any combination thereof. In some embodiments, the second passivation sub-layer 246 may be made of an oxide-based material, such as USG, other suitable materials, or any combination thereof. In some embodiments, the first passivation sub-layer 244 may serve as an etching stop layer for a subsequent process of etching the second passivation sub-layer 246. In some embodiments, the first passivation sub-layer 244 may have a thickness (T4) ranging from about 1000 Å to about 2000 Å, from about 1000 Å to about 1350 Å, from about 1350 Å to about 1500 Å, from about 1500 Å to about 1650 Å, or from about 1650 Å to about 2000 Å, but other ranges of values are also within the scope of this disclosure. If the thickness (T4) of the first passivation sub-layer 244 is too small, such as smaller than about 1000 Å, the first passivation sub-layer 244 may not be able to effectively serve as an etching stop layer to be used for etching the second passivation sub-layer 246. If the thickness (T4) of the first passivation sub-layer 244 is too large, such as greater than about 2000 Å, it may be difficult to perform etching through the first passivation sub-layer 244 in a subsequent etching process, which will be described hereinafter. In some embodiments, the second passivation sub-layer 246 may have a thickness (T5) ranging from about 7000 Å to about 10000 Å, from about 7000 Å to about 7650 Å, from about 7650 Å to about 8000 Å, from about 8000 Å to about 8500 Å, from about 8500 Å to about 9350 Å, or from about 9350 Å to about 10000 Å, but other ranges of values are also within the scope of this disclosure. If the thickness (T5) of the second passivation sub-layer 246 is too small, such as smaller than about 7000 Å, the second passivation sub-layer 246 may not be able to isolate a subsequently formed connecting feature 252 (see FIG. 17) from the semiconductor substrate 202. If the thickness (T5) of the second passivation sub-layer 246 is too large, such as greater than about 10000 Å, the production cost will be higher since a larger amount of material is needed to form the second passivation sub-layer 246.

Figure 15:
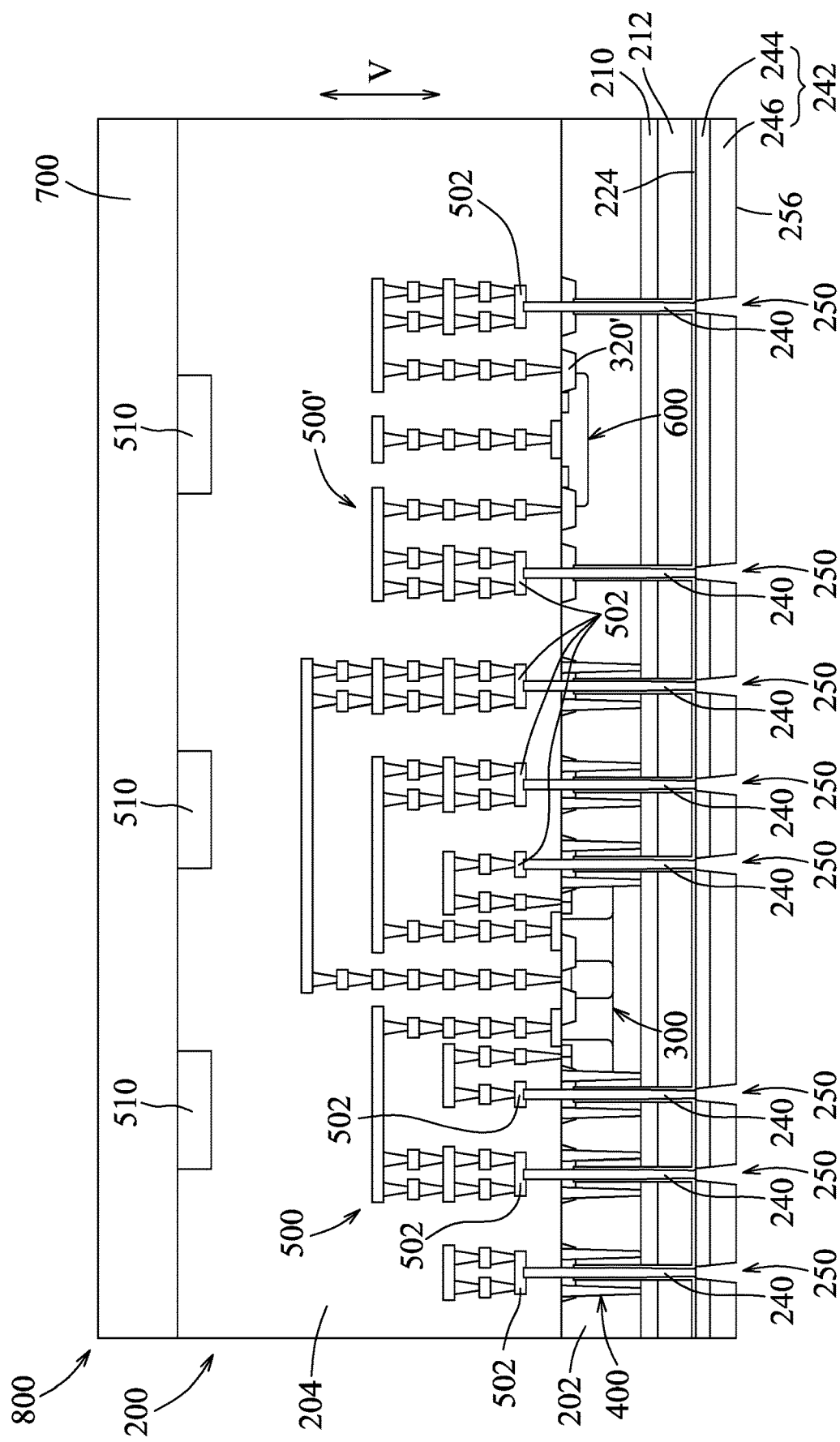

Referring to FIG. 1, the method 100 then proceeds to block 118, where the passivation layer is etched. Referring to FIG. 15, in some embodiments, the passivation layer 242 is etched to form a plurality of via holes 250 each corresponding in position to a respective one of the conductive structures 240. In some embodiments, each of the via holes 250 is aligned with the respective one of the conductive structures 240 in the direction (V). In some embodiments, the via holes 250 may be formed using a suitable technique, such as plasma dry etching, etc.

Figure 16:
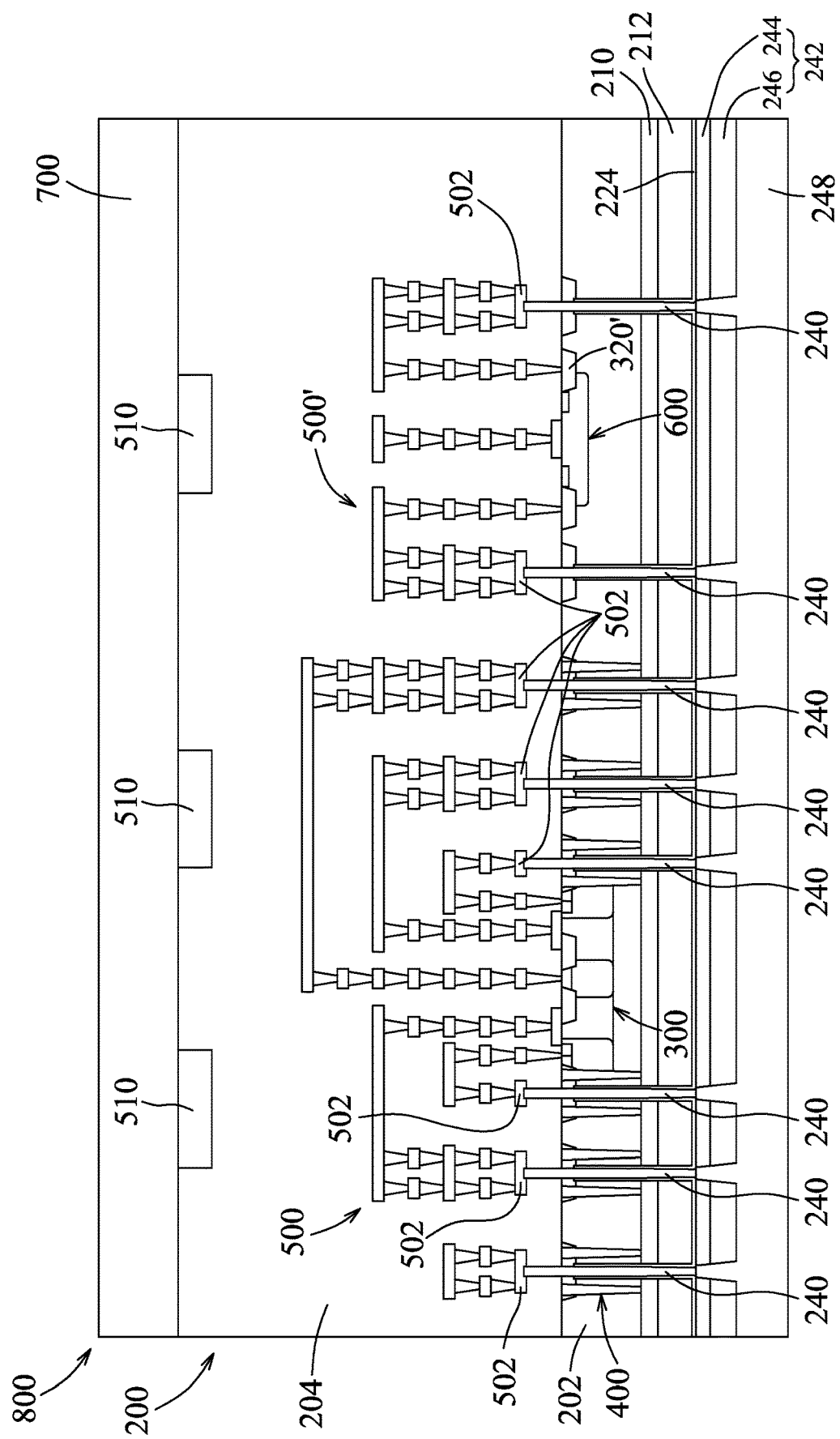

Referring to FIG. 1, the method 100 then proceeds to block 120, where a connecting layer is formed. Referring to FIG. 16, in some embodiments, the connecting layer 248 is formed on a backside 256 of the second passivation sub-layer 246 of the passivation layer 242 (see FIG. 15) to fill the via holes 250 (see FIG. 15). In some embodiments, the connecting layer 248 may be made of an aluminum-based material, such as Al—Cu alloy, other suitable materials, or any combination thereof. In some embodiments, the connecting layer 248 may be made using PVD, plating, other suitable techniques, or any combination thereof.

Figure 17:
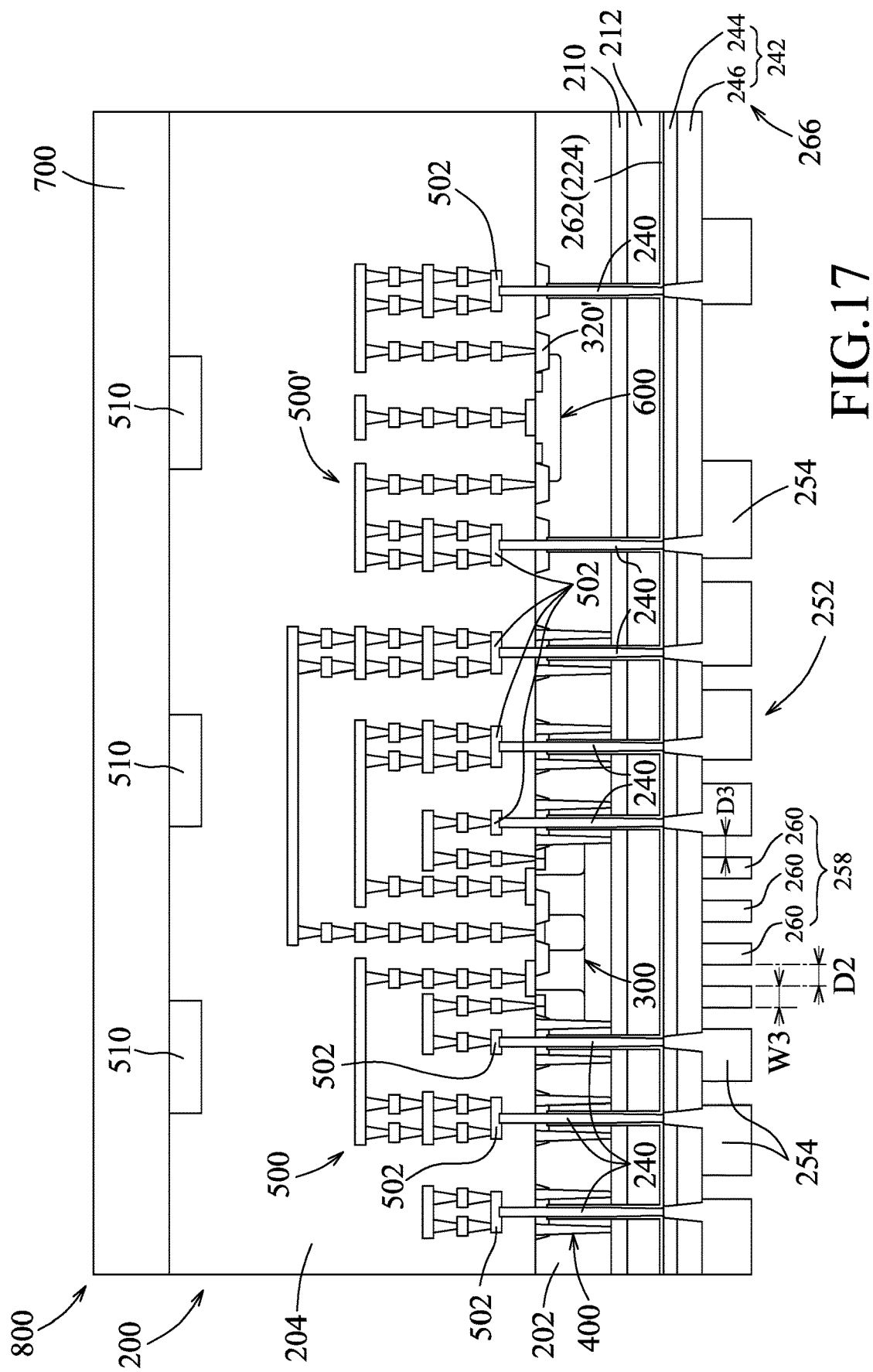

Referring to FIG. 1, the method 100 then proceeds to block 122, where the connecting layer 248 is etched. Referring to FIG. 17, in some embodiments, the connecting layer 248 (see FIG. 16) is etched to form the connecting feature 252 which includes a plurality of connecting pads 254 that are spaced apart from each other and that are respectively connected to the conductive structures 240. In some embodiments, the connecting feature 252 may further include a metal grid 258 for grounding purpose and/or serving as a reduced surface field (RESURF) layer. In some embodiments, the metal grid 258 is finger-shaped or is of other suitable shapes, and may include a plurality of grid portions 260. In some embodiments, each of the grid portions 260 may have a maximum width (W3) ranging from about 20 μm to about 45 μm, from about 20 μm to about 25 μm, from about 25 μm to about 30 μm, from about 30 μm to about 35 μm, from about 35 μm to about 40 μm, or from about 40 μm to about 45 μm, but other ranges of values are also within the scope of this disclosure. If the maximum width (W3) of each of the grid portions 260 is too small, such as less than about 20 μm, it may be difficult to precisely land a next-level interconnect (not shown) on the grid portion 260. If the maximum width (W3) of each of the grid portions 260 is too large, such as greater than about 45 μm, the overall dimension of the metal grid 258 may be too large. In some embodiments, a minimum distance (D2) between adjacent two of the grid portions 260 of the metal grid 258 may be greater than about 2 μm. If the minimum distance (D2) is too small, such as smaller than about 2 μm, the grid portions 260 of the metal grid 258 may not be insulated from each other. In some embodiments, a minimum distance (D3) between the metal grid 258 and an adjacent one of the connecting pads 254 of the connecting feature 252 may be not less than about 2 μm. If the minimum distance (D3) is too small, such as smaller than about 2 μm, the metal grid 258 and the adjacent one of the connecting pads 254 of the connecting feature 252 may not be insulated from each other, which may cause short circuit issues.

The dielectric blanket layer 210, the mask layer 212, the first portion 262 of the dielectric filling layer 224, the first passivation sub-layer 244 and the second passivation sub-layer 246 (all of which may be collectively referred to as a passivation structure 266) disposed underneath the semiconductor substrate 202 opposite to the carrier wafer 700 may serve as a composite passivation layer, which may have the same function as that of the insulator layer of a silicon-on-insulator (SOI) wafer. Therefore, the semiconductor feature 800 can be made using a bulk silicon wafer, which is lower in cost compared with an SOI wafer, without use of the SOI wafer. In addition, the conductive structures 240 are formed after formation of the interconnecting structure 500, and is connected to the semiconductor device 300 (i.e., after the back-end-of-line (BEOL) process of making the semiconductor device 300). Therefore, possible contamination of the semiconductor device 300, a large portion of which usually occurs during the front-end-of-line (FEOL) process, may be minimized.

In accordance with some embodiments of the present disclosure, a semiconductor feature includes a semiconductor substrate, a dielectric structure, a semiconductor device, an interconnecting structure, a shallow trench isolation structure, two deep trench isolation structures, a passivation structure and a conductive structure. The dielectric structure is disposed on the semiconductor substrate. The semiconductor device is disposed on the semiconductor substrate. The interconnecting structure is disposed in the dielectric structure, and is electrically connected to the semiconductor device. The shallow trench isolation structure is disposed in the semiconductor substrate, and surrounds the semiconductor device. The deep trench isolation structures penetrate the semiconductor substrate and the shallow trench isolation structure, and surround the semiconductor device. The passivation structure is connected to the semiconductor substrate and the deep trench isolation structures, and is located opposite to the interconnecting structure. The conductive structure is surrounded by the passivation structure, penetrates the semiconductor substrate and the shallow trench isolation structure into the dielectric structure, is located between the deep trench isolation structures, and is electrically connected to the semiconductor device via the interconnecting structure.

In accordance with some embodiments of the present disclosure, the interconnecting structure includes a first metal layer adjacent to the semiconductor device, and a second metal layer away from the semiconductor device. The conductive structure is connected to the first metal layer of the interconnecting structure.

In accordance with some embodiments of the present disclosure, the semiconductor feature further includes a carrier wafer connected to surfaces of the dielectric structure and the second metal layer of the interconnecting structure opposite to the semiconductor substrate.

In accordance with some embodiments of the present disclosure, the passivation structure includes a dielectric blanket layer disposed on the backside of the semiconductor substrate, and a mask layer disposed on the dielectric blanket layer. The mask layer is made of an oxide-based material. The dielectric blanket layer is made of a high-k material.

In accordance with some embodiments of the present disclosure, the passivation structure further includes a passivation layer disposed on the mask layer, and including a first passivation sub-layer disposed on the mask layer and a second passivation sub-layer disposed on the first passivation sub-layer. The first passivation sub-layer is made of a nitride-based material, and the second passivation sub-layer is made of an oxide-based material.

In accordance with some embodiments of the present disclosure, the semiconductor feature further includes a dielectric filling layer including a first portion disposed between the mask layer and the first passivation sub-layer, and a second portion surrounding the conductive structure. The dielectric filling layer is made of a nitride-based material.

In accordance with some embodiments of the present disclosure, the semiconductor feature further includes a dielectric filling layer. A portion of the dielectric filling layer is made of a nitride-based material and surrounds the conductive structure.

In accordance with some embodiments of the present disclosure, the conductive structure includes a first portion surrounded by the passivation structure, and a second portion connected between the first portion of the conductive structure and the interconnecting structure. The second portion is located outside of the portion of the dielectric filling layer.

In accordance with some embodiments of the present disclosure, the conductive structure is separated from the deep trench isolation structures by the semiconductor substrate.

In accordance with some embodiments of the present disclosure, the conductive structure has a maximum width ranging from about 3.5 µm to about 4.5 µm.

In accordance with some embodiments of the present disclosure, each of the deep trench isolation structures has a maximum width ranging from about 0.6 µm to about 1.2 µm.

In accordance with some embodiments of the present disclosure, a minimum distance between the conductive structure and one of the deep trench isolation structures ranges from about 0.5 µm to about 1 µm.

In accordance with some embodiments of the present disclosure, a semiconductor feature includes a semiconductor substrate, a dielectric structure, a semiconductor device, an interconnecting structure, a plurality of shallow trench isolation structures, a plurality of deep trench isolation structures, a passivation structure and a plurality of conductive structures. The dielectric structure is disposed on the semiconductor substrate. The semiconductor device is disposed on the semiconductor substrate. The interconnecting structure is disposed in the dielectric structure, is electrically connected to the semiconductor device, and includes a plurality of first metal layers adjacent to the semiconductor devices and a plurality of second metal layers away from the semiconductor devices. The shallow trench isolation structures are disposed in the semiconductor substrate, surround the semiconductor device, and are respectively aligned with the first metal layers along a direction which is substantially perpendicular to a horizontal surface of the semiconductor substrate. The deep trench isolation structures are disposed in the semiconductor substrate and surround the semiconductor device. Each of the shallow trench isolation structures is penetrated by corresponding two of the deep trench isolation structures. The passivation structure is connected to the semiconductor substrate and the deep trench isolation structures, and is located opposite to the interconnecting structure. The conductive structures are surrounded by the passivation structure. Each of the conductive structures is located between corresponding two of the deep trench isolation structures, and penetrates the semiconductor substrate and a corresponding one of the shallow trench isolation structures into the dielectric structure to be electrically connected to a corresponding one of the first metal layers.

In accordance with some embodiments of the present disclosure, the semiconductor feature further includes a dielectric filling layer surrounding a portion of each of the conductive structures, and is connected between the conductive structures and the semiconductor substrate.

In accordance with some embodiments of the present disclosure, the passivation structure includes a high-k dielectric blanket layer disposed on the semiconductor substrate opposite to the interconnecting structure, an oxide-based mask layer disposed on the high-k dielectric blanket layer, a nitride-based first passivation sub-layer disposed on the oxide-based mask layer, and an oxide-based second passivation sub-layer disposed on the nitride-based first passivation sub-layer.

In accordance with some embodiments of the present disclosure, the semiconductor feature further includes a plurality of connecting pads. Each of the connecting pads penetrates the nitride-based first passivation sub-layer and the oxide-based second passivation sub-layer, and is electrically connected to a corresponding one of the conductive structures.

In accordance with some embodiments of the present disclosure, the semiconductor feature further includes a metal grid disposed on the oxide-based second passivation sub-layer, and is separated from the connecting pads.

In accordance with some embodiments of the present disclosure, a method for manufacturing a semiconductor feature includes: forming a semiconductor structure including a semiconductor substrate, a semiconductor device disposed on the semiconductor substrate, a dielectric structure disposed on the semiconductor substrate, a shallow trench isolation structure disposed in the semiconductor substrate and surrounding the semiconductor device, two deep trench isolation structures disposed in the semiconductor substrate, penetrating the shallow trench isolation structure and surrounding the semiconductor device, and an interconnecting structure disposed in the dielectric structure, electrically connected to the semiconductor device and including a first metal layer adjacent to the semiconductor device and a second metal layer away from the semiconductor device; connecting a carrier wafer to surfaces of the dielectric structure and the second metal layer opposite to the semiconductor substrate; reducing the thickness of the semiconductor substrate from a side of the semiconductor substrate opposite to the semiconductor device until the deep trench isolation structures are exposed; forming a dielectric blanket layer on the semiconductor substrate opposite to the semiconductor device; forming a mask layer on the dielectric blanket layer; forming a trench penetrating the mask layer and the dielectric blanket layer into the semiconductor substrate and terminating at the shallow trench isolation structure, the trench being located between the deep trench isolation structures; forming a dielectric filling layer including a first portion disposed on the mask layer, and a second portion disposed on a trench-defining wall which defines the trench; extending the trench to penetrate the shallow trench isolation structure into the dielectric structure, and terminate at the first metal layer, the second portion of the dielectric filling layer on a wall portion of the trench-defining wall being removed; and forming a conductive feature to fill the trench and to be electrically connected to the first metal layer.

In accordance with some embodiments of the present disclosure, the method further includes: forming a first passivation sub-layer on the mask layer opposite to the dielectric blanket layer, the first passivation sub-layer being made of a nitride-based material; forming a second passivation sub-layer disposed on the first passivation sub-layer opposite to the mask layer, the second passivation sub-layer being made of an oxide-based material; forming a via hole in the first and second passivation sub-layers to expose the conductive feature; forming a connecting layer on the second passivation sub-layer and filling the via hole to be electrically connected to the conductive feature; and etching the connecting layer to form a connecting feature which includes a connecting pad electrically connected to the conductive feature.

In accordance with some embodiments of the present disclosure, the step of etching the connecting layer further includes forming a metal grid which is disposed on the second passivation sub-layer and which is separated from the connecting pad.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor feature comprising:
   a semiconductor substrate;
   a dielectric structure disposed on the semiconductor substrate;
   a semiconductor device disposed on the semiconductor substrate;
   an interconnecting structure disposed in the dielectric structure and electrically connected to the semiconductor device;
   a shallow trench isolation structure disposed in the semiconductor substrate and surrounding the semiconductor device;
   two deep trench isolation structures penetrating the semiconductor substrate and the shallow trench isolation structure, and surrounding the semiconductor device;
   a passivation structure connected to the semiconductor substrate and the two deep trench isolation structures, and being located opposite to the interconnecting structure; and
   a conductive structure surrounded by the passivation structure, penetrating the semiconductor substrate and the shallow trench isolation structure into the dielectric structure, being located between the two deep trench isolation structures, being electrically connected to the semiconductor device via the interconnecting structure, and being separated from the two deep trench isolation structures by the semiconductor substrate.

2. The semiconductor feature as claimed in claim 1, wherein:
   the interconnecting structure includes a first metal layer adjacent to the semiconductor device, and a second metal layer away from the semiconductor device; and
   the conductive structure is connected to the first metal layer of the interconnecting structure.

3. The semiconductor feature as claimed in claim 2, wherein the semiconductor feature further includes a carrier wafer connected to surfaces of the dielectric structure and the second metal layer of the interconnecting structure opposite to the semiconductor substrate.

4. The semiconductor feature as claimed in claim 1, wherein:
the passivation structure includes a dielectric blanket layer disposed on the semiconductor substrate opposite to the dielectric structure, and a mask layer disposed on the dielectric blanket layer; and
the mask layer is made of an oxide-based material, and the dielectric blanket layer is made of a high-k material.

5. The semiconductor feature as claimed in claim 4, wherein:
the passivation structure further includes a passivation layer disposed on the mask layer, and including a first passivation sub-layer disposed on the mask layer and a second passivation sub-layer disposed on the first passivation sub-layer; and
the first passivation sub-layer is made of a nitride-based material, and the second passivation sub-layer is made of an oxide-based material.

6. The semiconductor feature as claimed in claim 5, wherein:
the semiconductor feature further includes a dielectric filling layer including a first portion disposed between the mask layer and the first passivation sub-layer, and a second portion surrounding the conductive structure; and
the dielectric filling layer is made of a nitride-based material.

7. The semiconductor feature as claimed in claim 1, further comprising a dielectric filling layer, a portion of the dielectric filling layer being made of a nitride-based material and surrounding the conductive structure.

8. The semiconductor feature as claimed in claim 7, wherein the conductive structure includes a first portion surrounded by the passivation structure, and a second portion connected between the first portion of the conductive structure and the interconnecting structure, the second portion being located outside of the portion of the dielectric filling layer.

9. The semiconductor feature as claimed in claim 1, wherein the conductive structure has a maximum width ranging from about 3.5 µm to about 4.5 µm.

10. The semiconductor feature as claimed in claim 1, wherein each of the two deep trench isolation structures has a maximum width ranging from about 0.6 µm to about 1.2 µm.

11. The semiconductor feature as claimed in claim 1, wherein a minimum distance between the conductive structure and one of the two deep trench isolation structures ranges from about 0.5 µm to about 1 µm.

12. A semiconductor feature comprising:
a semiconductor substrate;
a dielectric structure disposed on the semiconductor substrate;
a semiconductor device disposed on the semiconductor substrate;
an interconnecting structure disposed in the dielectric structure, electrically connected to the semiconductor device, and includes a plurality of first metal layers adjacent to the semiconductor device and a plurality of second metal layers away from the semiconductor device;
a plurality of shallow trench isolation structures disposed in the semiconductor substrate, surrounding the semiconductor device, and respectively aligned with the first metal layers along a direction which is substantially perpendicular to a horizontal surface of the semiconductor substrate;
a plurality of deep trench isolation structures disposed in the semiconductor substrate and surrounding the semiconductor device, each of the shallow trench isolation structures being penetrated by corresponding two of the deep trench isolation structures;
a passivation structure connected to the semiconductor substrate and the deep trench isolation structures, and being located opposite to the interconnecting structure; and
a plurality of conductive structures surrounded by the passivation structure, each of the conductive structures being located between corresponding two of the deep trench isolation structures, penetrating the semiconductor substrate and a corresponding one of the shallow trench isolation structures into the dielectric structure to be electrically connected to a corresponding one of the first metal layers, and being separated from the corresponding two of the deep trench isolation structures by the semiconductor substrate.

13. The semiconductor feature as claimed in claim 12, further comprising a dielectric filling layer surrounding a portion of each of the conductive structures, and connecting between the conductive structures and the semiconductor substrate.

14. The semiconductor feature as claimed in claim 12, wherein the passivation structure includes a high-k dielectric blanket layer disposed on the semiconductor substrate opposite to the interconnecting structure, an oxide-based mask layer disposed on the high-k dielectric blanket layer, a nitride-based first passivation sub-layer disposed on the oxide-based mask layer, and an oxide-based second passivation sub-layer disposed on the nitride-based first passivation sub-layer.

15. The semiconductor feature as claimed in claim 14, further comprising a plurality of connecting pads, each of the connecting pads penetrating the nitride-based first passivation sub-layer and the oxide-based second passivation sub-layer and being electrically connected to a corresponding one of the conductive structures.

16. The semiconductor feature as claimed in claim 14, further comprising a metal grid disposed on the oxide-based second passivation sub-layer and being separated from the connecting pads.

17. A semiconductor feature comprising:
a semiconductor substrate;
a semiconductor device disposed on the semiconductor substrate;
an interconnecting structure disposed on the semiconductor substrate and electrically connected to the semiconductor device;
a shallow trench isolation structure disposed in the semiconductor substrate and surrounding the semiconductor device;
two deep trench isolation structures penetrating the semiconductor substrate and the shallow trench isolation structure, and surrounding the semiconductor device;
a passivation structure connected to the semiconductor substrate and the two deep trench isolation structures, and being located opposite to the interconnecting structure; and
a conductive structure surrounded by the passivation structure, penetrating the semiconductor substrate and the shallow trench isolation structure, being located between the two deep trench isolation structures, being electrically connected to the semiconductor device via the interconnecting structure, and being separated from the two deep trench isolation structures by the semiconductor substrate.

18. The semiconductor feature as claimed in claim 17, wherein:
   the interconnecting structure includes a first metal layer adjacent to the semiconductor device, and a second metal layer away from the semiconductor device; and
   the conductive structure is connected to the first metal layer of the interconnecting structure.

19. The semiconductor feature as claimed in claim 17, wherein:
   the passivation structure includes a dielectric blanket layer disposed on the semiconductor substrate opposite to the interconnecting structure, a mask layer disposed on the dielectric blanket layer opposite to the semiconductor substrate, and a passivation layer disposed on the mask layer opposite to the dielectric blanket layer; and
   the mask layer is made of an oxide-based material, and the dielectric blanket layer is made of a high-k material.

20. The semiconductor feature as claimed in claim 17, wherein
   the passivation structure includes a dielectric blanket layer disposed on the semiconductor substrate opposite to the dielectric structure, and a mask layer disposed on the dielectric blanket layer; and
   the mask layer is made of an oxide-based material, and the dielectric blanket layer is made of a high-k material.

* * * * *